United States Patent
Higashino

(10) Patent No.: US 8,724,441 B2
(45) Date of Patent: May 13, 2014

(54) ENCODING DEVICE, ENCODING METHOD, RECORDING DEVICE, RECORDING METHOD, OPTICAL RECORDING MEDIUM, DECODING DEVICE AND DECODING METHOD

(75) Inventor: Satoru Higashino, Tokyo (JP)

(73) Assignee: Sony Corporation, Tokyo (JP)

( * ) Notice: Subject to any disclaimer, the term of this patent is extended or adjusted under 35 U.S.C. 154(b) by 437 days.

(21) Appl. No.: 13/097,478

(22) Filed: Apr. 29, 2011

(65) Prior Publication Data

US 2011/0276990 A1 Nov. 10, 2011

(30) Foreign Application Priority Data

May 6, 2010 (JP) ................................. 2010-106319

(51) Int. Cl.
*G11B 20/14* (2006.01)

(52) U.S. Cl.
USPC ........................... 369/59.24; 369/103; 341/59

(58) Field of Classification Search
USPC .................. 341/52, 58, 59; 369/47.15, 59.24, 369/275.1, 275.4; 720/718
See application file for complete search history.

(56) References Cited

U.S. PATENT DOCUMENTS

| | | | |
|---|---|---|---|
| 5,696,505 A | 12/1997 | Schouhamer Immink | |
| 6,297,753 B1 * | 10/2001 | Hayami | 341/59 |
| 6,300,886 B1 * | 10/2001 | Hayami | 341/59 |
| 6,445,313 B2 * | 9/2002 | Ahn | 341/59 |
| 7,009,532 B2 * | 3/2006 | Ushiyama et al. | 341/59 |
| 7,545,292 B2 * | 6/2009 | Nakagawa | 341/58 |
| 8,384,567 B2 | 2/2013 | Higashino | |
| 8,390,483 B2 | 3/2013 | Higashino | |
| 2001/0017594 A1 | 8/2001 | Ahn | |
| 2007/0186840 A1 | 8/2007 | Dvorak | |
| 2008/0080353 A1 | 4/2008 | Yamawaki | |
| 2008/0205257 A1 | 8/2008 | Yamatsu et al. | |

FOREIGN PATENT DOCUMENTS

| | | |
|---|---|---|
| JP | 2008-176902 A | 7/2008 |
| JP | 2009-135144 A | 6/2009 |
| WO | WO 95/22802 | 8/1995 |

OTHER PUBLICATIONS

Schouhamer Immink, Kees A., "EFMPlus:The Coding Format of the Multimedia Compact Disc", IEEE Transaction on Consumer Electronics, Aug. 3, 1995, pp. 491-497, vol. 41, No. 3, The Netherlands.

* cited by examiner

*Primary Examiner* — Brenda Bernardi
(74) *Attorney, Agent, or Firm* — Wolf, Greenfield & Sacks, P.C.

(57) ABSTRACT

An encoding device for converting m-bit data words into n-bit (both n and m are integers and $2^n \geq 2^m \times 2$) code words includes a first encoding table in which $2^m$ code words selected from the $2^n$ n-bit code words correspond to $2^m$ m-bit data words, a second encoding table in which $2^m$ code words, which do not overlap with the code words in the first encoding table, of the $2^n$ n-bit code words correspond to $2^m$ m-bit data words, and an encoding unit which selects and outputs a code word, in which an absolute value of a code string DSV is smaller, from code words corresponding to the input m-bit data words in the first encoding table and code words corresponding to the input m-bit data words in the second encoding table.

17 Claims, 26 Drawing Sheets

| | | ⟨S1⟩ | | | | |
|---|---|---|---|---|---|---|
| | | Data | Code | State | DSV | O/E |
| | 0 | 0x0 | 0100100100100000 | 1 | -4 | 0 |
| | 1 | 0x1 | 1001000010010000 | 1 | -4 | 0 |
| | 2 | 0x2 | 0100100010010000 | 1 | -4 | 0 |
| | 3 | 0x3 | 1001000001001000 | 1 | -4 | 0 |
| | 4 | 0x4 | 0100100001001000 | 1 | -4 | 0 |
| | 5 | 0x5 | 1001000000100100 | 1 | -4 | 0 |
| | 6 | 0x6 | 0100100000100100 | 1 | -4 | 0 |
| | 7 | 0x7 | 1001000000010010 | 2 | -4 | 0 |
| | 8 | 0x8 | 0100100000010010 | 2 | -4 | 0 |
| | 9 | 0x9 | 1001000000001001 | 2 | -4 | 0 |
| | 10 | 0xA | 0100100000001001 | 2 | -4 | 0 |
| | 11 | 0xB | 1000000100000000 | 1 | -2 | 0 |
| | 12 | 0xC | 0100000010000000 | 1 | -2 | 0 |
| | 13 | 0xD | 1001001000100000 | 1 | -2 | 0 |
| | 14 | 0xE | 1000100100100000 | 1 | -2 | 0 |
| | 15 | 0xF | 1001000100010000 | 1 | -2 | 0 |
| | 16 | 0x10 | 0100100100010000 | 1 | -2 | 0 |
| | 17 | 0x11 | 1000100010010000 | 1 | -2 | 0 |
| | 18 | 0x12 | 0100010010010000 | 1 | -2 | 0 |
| | 19 | 0x13 | 1001000010001000 | 1 | -2 | 0 |
| | 20 | 0x14 | 0100100010001000 | 1 | -2 | 0 |
| | 21 | 0x15 | 1000100001001000 | 1 | -2 | 0 |
| | 22 | 0x16 | 0100010001001000 | 1 | -2 | 0 |
| | 23 | 0x17 | 1001000001000100 | 1 | -2 | 0 |
| | 24 | 0x18 | 0100100001000100 | 1 | -2 | 0 |
| | 25 | 0x19 | 1000100000100100 | 1 | -2 | 0 |
| | 26 | 0x1A | 0100010000100100 | 1 | -2 | 0 |
| | 27 | 0x1B | 1001000000100010 | 2 | -2 | 0 |
| | 28 | 0x1C | 0100100000100010 | 2 | -2 | 0 |
| | 29 | 0x1D | 1000100000010010 | 2 | -2 | 0 |
| | 30 | 0x1E | 0100010000010010 | 2 | -2 | 0 |
| | 31 | 0x1F | 1001000000010001 | 2 | -2 | 0 |
| | 32 | 0x20 | 0100100000010001 | 2 | -2 | 0 |
| | 33 | 0x21 | 1000100000001001 | 2 | -2 | 0 |
| | 34 | 0x22 | 0100010000001001 | 2 | -2 | 0 |
| | 35 | 0x23 | 1000000010000000 | 1 | 0 | 0 |
| | 36 | 0x24 | 0100000001000000 | 1 | 0 | 0 |
| | 37 | 0x25 | 1001001000010000 | 1 | 0 | 0 |
| | 38 | 0x26 | 1000100100010000 | 1 | 0 | 0 |
| | 39 | 0x27 | 1000010010010000 | 1 | 0 | 0 |
| | 40 | 0x28 | 1001000100001000 | 1 | 0 | 0 |
| | 41 | 0x29 | 0100100100001000 | 1 | 0 | 0 |
| | 42 | 0x2A | 1000100010001000 | 1 | 0 | 0 |
| | 43 | 0x2B | 0100100010001000 | 1 | 0 | 0 |
| | 44 | 0x2C | 1000010001001000 | 1 | 0 | 0 |
| | 45 | 0x2D | 0100010001001000 | 1 | 0 | 0 |
| | 46 | 0x2E | 1001000010000100 | 1 | 0 | 0 |
| | 47 | 0x2F | 0100100010000100 | 1 | 0 | 0 |
| | 48 | 0x30 | 1000100001000100 | 1 | 0 | 0 |
| | 49 | 0x31 | 0100010001000100 | 1 | 0 | 0 |
| | 50 | 0x32 | 1000010000100100 | 1 | 0 | 0 |
| | 51 | 0x33 | 0100001000100100 | 1 | 0 | 0 |
| | 52 | 0x34 | 1001000001000010 | 2 | 0 | 0 |
| | 53 | 0x35 | 0100100001000010 | 2 | 0 | 0 |
| | 54 | 0x36 | 1000100000100010 | 2 | 0 | 0 |
| | 55 | 0x37 | 0100010000100010 | 2 | 0 | 0 |
| | 56 | 0x38 | 1000010000010010 | 2 | 0 | 0 |
| | 57 | 0x39 | 0100001000010010 | 2 | 0 | 0 |
| | 58 | 0x3A | 1001000000100001 | 2 | 0 | 0 |
| | 59 | 0x3B | 0100100000100001 | 2 | 0 | 0 |
| | 60 | 0x3C | 1000100000010001 | 2 | 0 | 0 |
| | 61 | 0x3D | 0100010000010001 | 2 | 0 | 0 |
| | 62 | 0x3E | 1000010000001001 | 2 | 0 | 0 |
| | 63 | 0x3F | 0100001000001001 | 2 | 0 | 0 |

FIG. 7

| Data | Code | State | | DSV | O/E |
|---|---|---|---|---|---|
| 64 | 0x40 | 1000000001000000 | 1 | 2 | 0 |
| 65 | 0x41 | 0100000000100000 | 1 | 2 | 0 |
| 66 | 0x42 | 1001001000001000 | 1 | 2 | 0 |
| 67 | 0x43 | 1000100100001000 | 1 | 2 | 0 |
| 68 | 0x44 | 1000010010001000 | 1 | 2 | 0 |
| 69 | 0x45 | 1000001001001000 | 1 | 2 | 0 |
| 70 | 0x46 | 1001000100000100 | 1 | 2 | 0 |
| 71 | 0x47 | 0100100100000100 | 1 | 2 | 0 |
| 72 | 0x48 | 1000100010000100 | 1 | 2 | 0 |
| 73 | 0x49 | 0100010010000100 | 1 | 2 | 0 |
| 74 | 0x4A | 1000010001000100 | 1 | 2 | 0 |
| 75 | 0x4B | 0100001001000100 | 1 | 2 | 0 |
| 76 | 0x4C | 1000001000100100 | 1 | 2 | 0 |
| 77 | 0x4D | 0100000100100100 | 1 | 2 | 0 |
| 78 | 0x4E | 1001000010000010 | 2 | 2 | 0 |
| 79 | 0x4F | 0100100010000010 | 2 | 2 | 0 |
| 80 | 0x50 | 1000100001000010 | 2 | 2 | 0 |
| 81 | 0x51 | 0100010001000010 | 2 | 2 | 0 |
| 82 | 0x52 | 1000010000100010 | 2 | 2 | 0 |
| 83 | 0x53 | 0100001000100010 | 2 | 2 | 0 |
| 84 | 0x54 | 1000001000010010 | 2 | 2 | 0 |
| 85 | 0x55 | 0100000100010010 | 2 | 2 | 0 |
| 86 | 0x56 | 1001000001000001 | 2 | 2 | 0 |
| 87 | 0x57 | 0100100001000001 | 2 | 2 | 0 |
| 88 | 0x58 | 1000100000100001 | 2 | 2 | 0 |
| 89 | 0x59 | 0100010000100001 | 2 | 2 | 0 |
| 90 | 0x5A | 1000010000010001 | 2 | 2 | 0 |
| 91 | 0x5B | 0100001000010001 | 2 | 2 | 0 |
| 92 | 0x5C | 1000001000001001 | 2 | 2 | 0 |
| 93 | 0x5D | 0100000100001001 | 2 | 2 | 0 |
| 94 | 0x5E | 1001001001001001 | 2 | 2 | 0 |
| 95 | 0x5F | 1000000000100000 | 1 | 4 | 0 |
| 96 | 0x60 | 0100000000010000 | 1 | 4 | 0 |
| 97 | 0x61 | 1001001000000100 | 1 | 4 | 0 |
| 98 | 0x62 | 1000100100000100 | 1 | 4 | 0 |
| 99 | 0x63 | 1000010010000100 | 1 | 4 | 0 |
| 100 | 0x64 | 1000001001000100 | 1 | 4 | 0 |
| 101 | 0x65 | 1000000100100100 | 1 | 4 | 0 |
| 102 | 0x66 | 1001000100000010 | 2 | 4 | 0 |
| 103 | 0x67 | 0100100100000010 | 2 | 4 | 0 |
| 104 | 0x68 | 1000100010000010 | 2 | 4 | 0 |
| 105 | 0x69 | 0100010010000010 | 2 | 4 | 0 |
| 106 | 0x6A | 1000010001000010 | 2 | 4 | 0 |
| 107 | 0x6B | 0100001001000010 | 2 | 4 | 0 |
| 108 | 0x6C | 1000001000100010 | 2 | 4 | 0 |
| 109 | 0x6D | 0100000100100010 | 2 | 4 | 0 |
| 110 | 0x6E | 1000000100010010 | 2 | 4 | 0 |
| 111 | 0x6F | 0100000010010010 | 2 | 4 | 0 |
| 112 | 0x70 | 1001000010000001 | 2 | 4 | 0 |
| 113 | 0x71 | 0100100010000001 | 2 | 4 | 0 |
| 114 | 0x72 | 1000100001000001 | 2 | 4 | 0 |
| 115 | 0x73 | 0100010001000001 | 2 | 4 | 0 |
| 116 | 0x74 | 1000010000100001 | 2 | 4 | 0 |
| 117 | 0x75 | 0100001000100001 | 2 | 4 | 0 |
| 118 | 0x76 | 1000001000010001 | 2 | 4 | 0 |
| 119 | 0x77 | 0100000100010001 | 2 | 4 | 0 |
| 120 | 0x78 | 1000000100001001 | 2 | 4 | 0 |
| 121 | 0x79 | 0100000010001001 | 2 | 4 | 0 |
| 122 | 0x7A | 1000000000010000 | 1 | 6 | 0 |
| 123 | 0x7B | 0100000000001000 | 1 | 6 | 0 |
| 124 | 0x7C | 1001001000000010 | 2 | 6 | 0 |
| 125 | 0x7D | 1000100100000010 | 2 | 6 | 0 |
| 126 | 0x7E | 1000010010000010 | 2 | 6 | 0 |
| 127 | 0x7F | 1000001001000010 | 2 | 6 | 0 |

FIG. 8

| Data | Code | | State | DSV | O/E |
|---|---|---|---|---|---|
| 128 | 0x80 | 1000000100100010 | 2 | 6 | 0 |
| 129 | 0x81 | 1000000010010010 | 2 | 6 | 0 |
| 130 | 0x82 | 0100010000000001 | 2 | -6 | 1 |
| 131 | 0x83 | 1001000000000010 | 2 | -6 | 1 |
| 132 | 0x84 | 0100100000000010 | 2 | -6 | 1 |
| 133 | 0x85 | 1001000000000100 | 1 | -4 | 1 |
| 134 | 0x86 | 0100100000000100 | 1 | -4 | 1 |
| 135 | 0x87 | 1000010000000001 | 2 | -4 | 1 |
| 136 | 0x88 | 0100001000000001 | 2 | -4 | 1 |
| 137 | 0x89 | 1000100000000010 | 2 | -4 | 1 |
| 138 | 0x8A | 0100010000000010 | 2 | -4 | 1 |
| 139 | 0x8B | 1000100000000100 | 1 | -2 | 1 |
| 140 | 0x8C | 0100010000000100 | 1 | -2 | 1 |
| 141 | 0x8D | 1000001000000001 | 2 | -2 | 1 |
| 142 | 0x8E | 0100000100000001 | 2 | -2 | 1 |
| 143 | 0x8F | 1001001001000001 | 2 | -2 | 1 |
| 144 | 0x90 | 1001000100100001 | 2 | -2 | 1 |
| 145 | 0x91 | 0100100100100001 | 2 | -2 | 1 |
| 146 | 0x92 | 1001000000001000 | 1 | -2 | 1 |
| 147 | 0x93 | 0100100000001000 | 1 | -2 | 1 |
| 148 | 0x94 | 1001000010010001 | 2 | -2 | 1 |
| 149 | 0x95 | 0100100010010001 | 2 | -2 | 1 |
| 150 | 0x96 | 1000010000000010 | 2 | -2 | 1 |
| 151 | 0x97 | 0100001000000010 | 2 | -2 | 1 |
| 152 | 0x98 | 1001000001001001 | 2 | -2 | 1 |
| 153 | 0x99 | 0100100001001001 | 2 | -2 | 1 |
| 154 | 0x9A | 1001001001000010 | 2 | 0 | 1 |
| 155 | 0x9B | 1001000000010000 | 1 | 0 | 1 |
| 156 | 0x9C | 1001000100100010 | 2 | 0 | 1 |
| 157 | 0x9D | 0100100100100010 | 2 | 0 | 1 |
| 158 | 0x9E | 1000010000000100 | 1 | 0 | 1 |
| 159 | 0x9F | 0100001000000100 | 1 | 0 | 1 |
| 160 | 0xA0 | 0100100000010000 | 1 | 0 | 1 |
| 161 | 0xA1 | 1001000010010010 | 2 | 0 | 1 |
| 162 | 0xA2 | 0100100010010010 | 2 | 0 | 1 |
| 163 | 0xA3 | 1000000100000001 | 2 | 0 | 1 |
| 164 | 0xA4 | 0100000010000001 | 2 | 0 | 1 |
| 165 | 0xA5 | 1001001000100001 | 2 | 0 | 1 |
| 166 | 0xA6 | 1000100100100001 | 2 | 0 | 1 |
| 167 | 0xA7 | 1000100000001000 | 1 | 0 | 1 |
| 168 | 0xA8 | 0100010000001000 | 1 | 0 | 1 |
| 169 | 0xA9 | 1001000100010001 | 2 | 0 | 1 |
| 170 | 0xAA | 0100100100010001 | 2 | 0 | 1 |
| 171 | 0xAB | 1000100010010001 | 2 | 0 | 1 |
| 172 | 0xAC | 0100010010010001 | 2 | 0 | 1 |
| 173 | 0xAD | 1000001000000010 | 2 | 0 | 1 |
| 174 | 0xAE | 0100000100000010 | 2 | 0 | 1 |
| 175 | 0xAF | 1001000010001001 | 2 | 0 | 1 |
| 176 | 0xB0 | 0100100010001001 | 2 | 0 | 1 |
| 177 | 0xB1 | 1000100001001001 | 2 | 0 | 1 |
| 178 | 0xB2 | 0100010001001001 | 2 | 0 | 1 |
| 179 | 0xB3 | 0100100000100000 | 1 | 2 | 1 |
| 180 | 0xB4 | 1001001000100010 | 2 | 2 | 1 |
| 181 | 0xB5 | 1000100100100010 | 2 | 2 | 1 |
| 182 | 0xB6 | 1000001000000100 | 1 | 2 | 1 |
| 183 | 0xB7 | 1000100000010000 | 1 | 2 | 1 |
| 184 | 0xB8 | 1001000100010010 | 2 | 2 | 1 |
| 185 | 0xB9 | 0100100100010010 | 2 | 2 | 1 |
| 186 | 0xBA | 0100000100000100 | 1 | 2 | 1 |
| 187 | 0xBB | 1000100010010010 | 2 | 2 | 1 |
| 188 | 0xBC | 0100010010010010 | 2 | 2 | 1 |
| 189 | 0xBD | 0100010000010000 | 1 | 2 | 1 |
| 190 | 0xBE | 1000000010000001 | 2 | 2 | 1 |
| 191 | 0xBF | 0100000001000001 | 2 | 2 | 1 |

FIG. 9

| Data | Code | | State | DSV | O/E |
|---|---|---|---|---|---|
| 192 | 0xC0 | 1001001001000100 | 1 | 2 | 1 |
| 193 | 0xC1 | 1000010000001000 | 1 | 2 | 1 |
| 194 | 0xC2 | 1001000100100100 | 1 | 2 | 1 |
| 195 | 0xC3 | 1001001000010001 | 2 | 2 | 1 |
| 196 | 0xC4 | 0100100100100100 | 1 | 2 | 1 |
| 197 | 0xC5 | 1000100100010001 | 2 | 2 | 1 |
| 198 | 0xC6 | 1000010010010001 | 2 | 2 | 1 |
| 199 | 0xC7 | 1000000100000010 | 2 | 2 | 1 |
| 200 | 0xC8 | 0100001000001000 | 1 | 2 | 1 |
| 201 | 0xC9 | 1001000100001001 | 2 | 2 | 1 |
| 202 | 0xCA | 0100100100001001 | 2 | 2 | 1 |
| 203 | 0xCB | 1001000000100000 | 1 | 2 | 1 |
| 204 | 0xCC | 1000100010001001 | 2 | 2 | 1 |
| 205 | 0xCD | 0100010010001001 | 2 | 2 | 1 |
| 206 | 0xCE | 0100000010000010 | 2 | 2 | 1 |
| 207 | 0xCF | 1000010001001001 | 2 | 2 | 1 |
| 208 | 0xD0 | 0100001001001001 | 2 | 2 | 1 |
| 209 | 0xD1 | 1000100000100000 | 1 | 4 | 1 |
| 210 | 0xD2 | 0100000001000010 | 2 | 4 | 1 |
| 211 | 0xD3 | 0100010000100000 | 1 | 4 | 1 |
| 212 | 0xD4 | 1001001001001000 | 1 | 4 | 1 |
| 213 | 0xD5 | 1001001000010010 | 2 | 4 | 1 |
| 214 | 0xD6 | 1000000100000100 | 1 | 4 | 1 |
| 215 | 0xD7 | 1000100100010010 | 2 | 4 | 1 |
| 216 | 0xD8 | 1000010010010010 | 2 | 4 | 1 |
| 217 | 0xD9 | 1000010000010000 | 1 | 4 | 1 |
| 218 | 0xDA | 0100000010000100 | 1 | 4 | 1 |
| 219 | 0xDB | 0100001000010000 | 1 | 4 | 1 |
| 220 | 0xDC | 1001000001000000 | 1 | 4 | 1 |
| 221 | 0xDD | 1000000001000001 | 2 | 4 | 1 |
| 222 | 0xDE | 0100100001000000 | 1 | 4 | 1 |
| 223 | 0xDF | 0100000000100001 | 2 | 4 | 1 |
| 224 | 0xE0 | 1001001000100100 | 1 | 4 | 1 |
| 225 | 0xE1 | 1000100100100100 | 1 | 4 | 1 |
| 226 | 0xE2 | 1000001000001000 | 1 | 4 | 1 |
| 227 | 0xE3 | 1001001000001001 | 2 | 4 | 1 |
| 228 | 0xE4 | 1000100100001001 | 2 | 4 | 1 |
| 229 | 0xE5 | 1000010010001001 | 2 | 4 | 1 |
| 230 | 0xE6 | 1000000010000010 | 2 | 4 | 1 |
| 231 | 0xE7 | 1000001001001001 | 2 | 4 | 1 |
| 232 | 0xE8 | 0100000100001000 | 1 | 4 | 1 |
| 233 | 0xE9 | 1000010000100000 | 1 | 6 | 1 |
| 234 | 0xEA | 1000000001000010 | 2 | 6 | 1 |
| 235 | 0xEB | 0100000010001000 | 1 | 6 | 1 |
| 236 | 0xEC | 0100001000100000 | 1 | 6 | 1 |
| 237 | 0xED | 0100000000100010 | 2 | 6 | 1 |
| 238 | 0xEE | 0100100010000000 | 1 | 6 | 1 |
| 239 | 0xEF | 1000000001000100 | 1 | 6 | 1 |
| 240 | 0xF0 | 1000001000010000 | 1 | 6 | 1 |
| 241 | 0xF1 | 0100000100010000 | 1 | 6 | 1 |
| 242 | 0xF2 | 0100000001000100 | 1 | 6 | 1 |
| 243 | 0xF3 | 1000100001000000 | 1 | 6 | 1 |
| 244 | 0xF4 | 1000000000100001 | 2 | 6 | 1 |
| 245 | 0xF5 | 0100010001000000 | 1 | 6 | 1 |
| 246 | 0xF6 | 1001000010000000 | 1 | 6 | 1 |
| 247 | 0xF7 | 0100000000010001 | 2 | 6 | 1 |
| 248 | 0xF8 | 1000000100001000 | 1 | 6 | 1 |
| 249 | 0xF9 | 1000000010001000 | 1 | 8 | 1 |
| 250 | 0xFA | 1000001000100000 | 1 | 8 | 1 |
| 251 | 0xFB | 1000100010000000 | 1 | 8 | 1 |
| 252 | 0xFC | 1000000000100010 | 2 | 8 | 1 |
| 253 | 0xFD | 0100000001001000 | 1 | 8 | 1 |
| 254 | 0xFE | 0100000100100000 | 1 | 8 | 1 |
| 255 | 0xFF | 0100010010000000 | 1 | 8 | 1 |

FIG. 10

| | | <S2> | | | | |
|---|---|---|---|---|---|---|
| | | Data | Code | State | DSV | mod2 |
| 0 | 0x0 | 0010001001000000 | 1 | 6 | 1 |
| 1 | 0x1 | 0010000001001000 | 1 | 6 | 1 |
| 2 | 0x2 | 0010000000010010 | 2 | 6 | 1 |
| 3 | 0x3 | 0010010010000000 | 1 | 6 | 1 |
| 4 | 0x4 | 0010000010010000 | 1 | 6 | 1 |
| 5 | 0x5 | 0010000000100100 | 1 | 6 | 1 |
| 6 | 0x6 | 0010000000001001 | 2 | 6 | 1 |
| 7 | 0x7 | 0010000100100000 | 1 | 6 | 1 |
| 8 | 0x8 | 0010000010001000 | 1 | 4 | 1 |
| 9 | 0x9 | 0010000000100010 | 2 | 4 | 1 |
| 10 | 0xA | 0001001001000000 | 1 | 4 | 1 |
| 11 | 0xB | 0000001000000000 | 1 | 4 | 1 |
| 12 | 0xC | 0001000001001000 | 1 | 4 | 1 |
| 13 | 0xD | 0001000000010010 | 2 | 4 | 1 |
| 14 | 0xE | 0010000100010000 | 1 | 4 | 1 |
| 15 | 0xF | 0001000010010000 | 1 | 4 | 1 |
| 16 | 0x10 | 0010000001000100 | 1 | 4 | 1 |
| 17 | 0x11 | 0010000000010001 | 2 | 4 | 1 |
| 18 | 0x12 | 0010010001000000 | 1 | 4 | 1 |
| 19 | 0x13 | 0001000000100100 | 1 | 4 | 1 |
| 20 | 0x14 | 0010001000100000 | 1 | 4 | 1 |
| 21 | 0x15 | 0001000000001001 | 2 | 4 | 1 |
| 22 | 0x16 | 0001000100100000 | 1 | 4 | 1 |
| 23 | 0x17 | 0010000001000010 | 2 | 2 | 1 |
| 24 | 0x18 | 0001000100001000 | 1 | 2 | 1 |
| 25 | 0x19 | 0001000000100010 | 2 | 2 | 1 |
| 26 | 0x1A | 0000100001001000 | 1 | 2 | 1 |
| 27 | 0x1B | 0000100000010010 | 2 | 2 | 1 |
| 28 | 0x1C | 0000000100000000 | 1 | 2 | 1 |
| 29 | 0x1D | 0010001000010000 | 1 | 2 | 1 |
| 30 | 0x1E | 0001000100010000 | 1 | 2 | 1 |
| 31 | 0x1F | 0010010000100000 | 1 | 2 | 1 |
| 32 | 0x20 | 0010000010000100 | 1 | 2 | 1 |
| 33 | 0x21 | 0010000000100001 | 2 | 2 | 1 |
| 34 | 0x22 | 0001000001000100 | 1 | 2 | 1 |
| 35 | 0x23 | 0001000000010001 | 2 | 2 | 1 |
| 36 | 0x24 | 0000100010010000 | 1 | 2 | 1 |
| 37 | 0x25 | 0000100000100100 | 1 | 2 | 1 |
| 38 | 0x26 | 0000100000001001 | 2 | 2 | 1 |
| 39 | 0x27 | 0001001000100000 | 1 | 2 | 1 |
| 40 | 0x28 | 0000100100100000 | 1 | 2 | 1 |
| 41 | 0x29 | 0010000100001000 | 1 | 2 | 1 |
| 42 | 0x2A | 0010000010000010 | 2 | 0 | 1 |
| 43 | 0x2B | 0001000001000010 | 2 | 0 | 1 |
| 44 | 0x2C | 0000100010001000 | 1 | 0 | 1 |
| 45 | 0x2D | 0000100000100010 | 2 | 0 | 1 |
| 46 | 0x2E | 0000100001001000 | 1 | 0 | 1 |
| 47 | 0x2F | 0000010000010010 | 2 | 0 | 1 |
| 48 | 0x30 | 0000000010000000 | 1 | 0 | 1 |
| 49 | 0x31 | 0010010000010000 | 1 | 0 | 1 |
| 50 | 0x32 | 0001001000010000 | 1 | 0 | 1 |
| 51 | 0x33 | 0010010010010010 | 2 | 0 | 1 |
| 52 | 0x34 | 0000100100010000 | 1 | 0 | 1 |
| 53 | 0x35 | 0010000100000100 | 1 | 0 | 1 |
| 54 | 0x36 | 0010000001000001 | 2 | 0 | 1 |
| 55 | 0x37 | 0001000010000100 | 1 | 0 | 1 |
| 56 | 0x38 | 0001000000100001 | 2 | 0 | 1 |
| 57 | 0x39 | 0000100001000100 | 1 | 0 | 1 |
| 58 | 0x3A | 0000100000010001 | 2 | 0 | 1 |
| 59 | 0x3B | 0000100010010000 | 1 | 0 | 1 |
| 60 | 0x3C | 0000100000100100 | 1 | 0 | 1 |
| 61 | 0x3D | 0000010000001001 | 2 | 0 | 1 |
| 62 | 0x3E | 0010001000001000 | 1 | 0 | 1 |
| 63 | 0x3F | 0010010010001001 | 2 | 0 | 1 |

FIG. 11

| Data | Code | | State | DSV | mod2 |
|---|---|---|---|---|---|
| 64 | 0x40 | 0001000100001000 | 1 | 0 | 1 |
| 65 | 0x41 | 0010001001001001 | 2 | 0 | 1 |
| 66 | 0x42 | 0010000100000010 | 2 | -2 | 1 |
| 67 | 0x43 | 0000100100001000 | 1 | -2 | 1 |
| 68 | 0x44 | 0001000010000010 | 2 | -2 | 1 |
| 69 | 0x45 | 0000100001000010 | 2 | -2 | 1 |
| 70 | 0x46 | 0000010010001000 | 1 | -2 | 1 |
| 71 | 0x47 | 0000010000100010 | 2 | -2 | 1 |
| 72 | 0x48 | 0000001000010010 | 2 | -2 | 1 |
| 73 | 0x49 | 0000001001001000 | 1 | -2 | 1 |
| 74 | 0x4A | 0010001000000100 | 1 | -2 | 1 |
| 75 | 0x4B | 0001000100000100 | 1 | -2 | 1 |
| 76 | 0x4C | 0010000010000001 | 2 | -2 | 1 |
| 77 | 0x4D | 0001000001000001 | 2 | -2 | 1 |
| 78 | 0x4E | 0000100010000100 | 1 | -2 | 1 |
| 79 | 0x4F | 0000100000100001 | 2 | -2 | 1 |
| 80 | 0x50 | 0000010000010001 | 2 | -2 | 1 |
| 81 | 0x51 | 0000010001000100 | 1 | -2 | 1 |
| 82 | 0x52 | 0010010010010001 | 2 | -2 | 1 |
| 83 | 0x53 | 0000001000100100 | 1 | -2 | 1 |
| 84 | 0x54 | 0000001000001001 | 2 | -2 | 1 |
| 85 | 0x55 | 0000000001000000 | 1 | -2 | 1 |
| 86 | 0x56 | 0010010000001000 | 1 | -2 | 1 |
| 87 | 0x57 | 0001001000001000 | 1 | -2 | 1 |
| 88 | 0x58 | 0010010001001001 | 2 | -2 | 1 |
| 89 | 0x59 | 0001001001001001 | 2 | -2 | 1 |
| 90 | 0x5A | 0001000100000010 | 2 | -4 | 1 |
| 91 | 0x5B | 0000100010000010 | 2 | -4 | 1 |
| 92 | 0x5C | 0000010001000010 | 2 | -4 | 1 |
| 93 | 0x5D | 0000001000100010 | 2 | -4 | 1 |
| 94 | 0x5E | 0000000100010010 | 2 | -4 | 1 |
| 95 | 0x5F | 0010010000000100 | 1 | -4 | 1 |
| 96 | 0x60 | 0001001000000100 | 1 | -4 | 1 |
| 97 | 0x61 | 0010000100000001 | 2 | -4 | 1 |
| 98 | 0x62 | 0001000010000001 | 2 | -4 | 1 |
| 99 | 0x63 | 0000100100000100 | 1 | -4 | 1 |
| 100 | 0x64 | 0000100001000001 | 2 | -4 | 1 |
| 101 | 0x65 | 0000010000100001 | 2 | -4 | 1 |
| 102 | 0x66 | 0000010010000100 | 1 | -4 | 1 |
| 103 | 0x67 | 0000001000010001 | 2 | -4 | 1 |
| 104 | 0x68 | 0000001001000100 | 1 | -4 | 1 |
| 105 | 0x69 | 0000000100001001 | 2 | -4 | 1 |
| 106 | 0x6A | 0000000100100100 | 1 | -4 | 1 |
| 107 | 0x6B | 0010001000000010 | 2 | -4 | 1 |
| 108 | 0x6C | 0000100100000010 | 2 | -6 | 1 |
| 109 | 0x6D | 0000010010000010 | 2 | -6 | 1 |
| 110 | 0x6E | 0000001001000010 | 2 | -6 | 1 |
| 111 | 0x6F | 0000000100100010 | 2 | -6 | 1 |
| 112 | 0x70 | 0000000010010010 | 2 | -6 | 1 |
| 113 | 0x71 | 0010001000000001 | 2 | -6 | 1 |
| 114 | 0x72 | 0001000100000001 | 2 | -6 | 1 |
| 115 | 0x73 | 0000100010000001 | 2 | -6 | 1 |
| 116 | 0x74 | 0000010001000001 | 2 | -6 | 1 |
| 117 | 0x75 | 0000001000100001 | 2 | -6 | 1 |
| 118 | 0x76 | 0000000100010001 | 2 | -6 | 1 |
| 119 | 0x77 | 0000000010001001 | 2 | -6 | 1 |
| 120 | 0x78 | 0010010000000010 | 2 | -6 | 1 |
| 121 | 0x79 | 0001001000000010 | 2 | -6 | 1 |
| 122 | 0x7A | 0010010000000001 | 2 | -8 | 1 |
| 123 | 0x7B | 0001001000000001 | 2 | -8 | 1 |
| 124 | 0x7C | 0000100100000001 | 2 | -8 | 1 |
| 125 | 0x7D | 0000010010000001 | 2 | -8 | 1 |
| 126 | 0x7E | 0000001001000001 | 2 | -8 | 1 |
| 127 | 0x7F | 0000000100100001 | 2 | -8 | 1 |

FIG. 12

| | Data | Code | State | DSV | mod2 |
|---|---|---|---|---|---|
| 128 | 0x80 | 0000000010010001 | 2 | −8 | 1 |
| 129 | 0x81 | 0000000001001001 | 2 | −8 | 1 |
| 130 | 0x82 | 0010000000000100 | 1 | 6 | 0 |
| 131 | 0x83 | 0001000000000010 | 2 | 6 | 0 |
| 132 | 0x84 | 0000100000000001 | 2 | 6 | 0 |
| 133 | 0x85 | 0010000000001000 | 1 | 4 | 0 |
| 134 | 0x86 | 0001000000000100 | 1 | 4 | 0 |
| 135 | 0x87 | 0000100000000010 | 2 | 4 | 0 |
| 136 | 0x88 | 0000010000000001 | 2 | 4 | 0 |
| 137 | 0x89 | 0010010010000001 | 2 | 4 | 0 |
| 138 | 0x8A | 0010001001000001 | 2 | 4 | 0 |
| 139 | 0x8B | 0010000100100001 | 2 | 4 | 0 |
| 140 | 0x8C | 0010000010010001 | 2 | 4 | 0 |
| 141 | 0x8D | 0010000001001001 | 2 | 4 | 0 |
| 142 | 0x8E | 0010000000010000 | 1 | 2 | 0 |
| 143 | 0x8F | 0001000000001000 | 1 | 2 | 0 |
| 144 | 0x90 | 0000100000000100 | 1 | 2 | 0 |
| 145 | 0x91 | 0000010000000010 | 2 | 2 | 0 |
| 146 | 0x92 | 0010010010000010 | 2 | 2 | 0 |
| 147 | 0x93 | 0010001001000010 | 2 | 2 | 0 |
| 148 | 0x94 | 0010000100100010 | 2 | 2 | 0 |
| 149 | 0x95 | 0010000010010010 | 2 | 2 | 0 |
| 150 | 0x96 | 0000001000000001 | 2 | 2 | 0 |
| 151 | 0x97 | 0010010001000001 | 2 | 2 | 0 |
| 152 | 0x98 | 0001001001000001 | 2 | 2 | 0 |
| 153 | 0x99 | 0010001000100001 | 2 | 2 | 0 |
| 154 | 0x9A | 0001000100100001 | 2 | 2 | 0 |
| 155 | 0x9B | 0010000100010001 | 2 | 2 | 0 |
| 156 | 0x9C | 0001000010010001 | 2 | 2 | 0 |
| 157 | 0x9D | 0010000010001001 | 2 | 2 | 0 |
| 158 | 0x9E | 0001000001001001 | 2 | 2 | 0 |
| 159 | 0x9F | 0010000000100000 | 1 | 0 | 0 |
| 160 | 0xA0 | 0001000000010000 | 1 | 0 | 0 |
| 161 | 0xA1 | 0000100000001000 | 1 | 0 | 0 |
| 162 | 0xA2 | 0000010000000100 | 1 | 0 | 0 |
| 163 | 0xA3 | 0010010010000100 | 1 | 0 | 0 |
| 164 | 0xA4 | 0010001001000100 | 1 | 0 | 0 |
| 165 | 0xA5 | 0010000100100100 | 1 | 0 | 0 |
| 166 | 0xA6 | 0000001000000010 | 2 | 0 | 0 |
| 167 | 0xA7 | 0010010001000010 | 2 | 0 | 0 |
| 168 | 0xA8 | 0001001001000010 | 2 | 0 | 0 |
| 169 | 0xA9 | 0010001000100010 | 2 | 0 | 0 |
| 170 | 0xAA | 0001000100100010 | 2 | 0 | 0 |
| 171 | 0xAB | 0010000100010010 | 2 | 0 | 0 |
| 172 | 0xAC | 0001000010010010 | 2 | 0 | 0 |
| 173 | 0xAD | 0000000100000001 | 2 | 0 | 0 |
| 174 | 0xAE | 0010010000100001 | 2 | 0 | 0 |
| 175 | 0xAF | 0010001000100001 | 2 | 0 | 0 |
| 176 | 0xB0 | 0000100100100001 | 2 | 0 | 0 |
| 177 | 0xB1 | 0010001000010001 | 2 | 0 | 0 |
| 178 | 0xB2 | 0001000100010001 | 2 | 0 | 0 |
| 179 | 0xB3 | 0000100010010001 | 2 | 0 | 0 |
| 180 | 0xB4 | 0010000100001001 | 2 | 0 | 0 |
| 181 | 0xB5 | 0001000010001001 | 2 | 0 | 0 |
| 182 | 0xB6 | 0000100001001001 | 2 | 0 | 0 |
| 183 | 0xB7 | 0010000001000000 | 1 | −2 | 0 |
| 184 | 0xB8 | 0001000000100000 | 1 | −2 | 0 |
| 185 | 0xB9 | 0000100000010000 | 1 | −2 | 0 |
| 186 | 0xBA | 0000010000001000 | 1 | −2 | 0 |
| 187 | 0xBB | 0010010010001000 | 1 | −2 | 0 |
| 188 | 0xBC | 0010001001001000 | 1 | −2 | 0 |
| 189 | 0xBD | 0000001000000100 | 1 | −2 | 0 |
| 190 | 0xBE | 0010010001000100 | 1 | −2 | 0 |
| 191 | 0xBF | 0001001001000100 | 1 | −2 | 0 |

FIG. 13

| Data | Code | | State | DSV | mod2 |
|---|---|---|---|---|---|
| 192 | 0xC0 | 0010001000100100 | 1 | -2 | 0 |
| 193 | 0xC1 | 0001000100100100 | 1 | -2 | 0 |
| 194 | 0xC2 | 0000000100000010 | 2 | -2 | 0 |
| 195 | 0xC3 | 0010010000100010 | 2 | -2 | 0 |
| 196 | 0xC4 | 0001001000100010 | 2 | -2 | 0 |
| 197 | 0xC5 | 0000100100100010 | 2 | -2 | 0 |
| 198 | 0xC6 | 0010001000010010 | 2 | -2 | 0 |
| 199 | 0xC7 | 0001000100010010 | 2 | -2 | 0 |
| 200 | 0xC8 | 0000100010010010 | 2 | -2 | 0 |
| 201 | 0xC9 | 0000000010000001 | 2 | -2 | 0 |
| 202 | 0xCA | 0010010000010001 | 2 | -2 | 0 |
| 203 | 0xCB | 0001001000010001 | 2 | -2 | 0 |
| 204 | 0xCC | 0000100100010001 | 2 | -2 | 0 |
| 205 | 0xCD | 0000010010010001 | 2 | -2 | 0 |
| 206 | 0xCE | 0010001000001001 | 2 | -2 | 0 |
| 207 | 0xCF | 0001000100001001 | 2 | -2 | 0 |
| 208 | 0xD0 | 0000100010001001 | 2 | -2 | 0 |
| 209 | 0xD1 | 0000010001001001 | 2 | -2 | 0 |
| 210 | 0xD2 | 0010000010000000 | 1 | -4 | 0 |
| 211 | 0xD3 | 0001000001000000 | 1 | -4 | 0 |
| 212 | 0xD4 | 0000100000100000 | 1 | -4 | 0 |
| 213 | 0xD5 | 0000010000010000 | 1 | -4 | 0 |
| 214 | 0xD6 | 0010010010010000 | 1 | -4 | 0 |
| 215 | 0xD7 | 0000001000001000 | 1 | -4 | 0 |
| 216 | 0xD8 | 0010010001001000 | 1 | -4 | 0 |
| 217 | 0xD9 | 0001001001001000 | 1 | -4 | 0 |
| 218 | 0xDA | 0000000100000100 | 1 | -4 | 0 |
| 219 | 0xDB | 0010010000100100 | 1 | -4 | 0 |
| 220 | 0xDC | 0001001000100100 | 1 | -4 | 0 |
| 221 | 0xDD | 0000100100100100 | 1 | -4 | 0 |
| 222 | 0xDE | 0000000010000010 | 2 | -4 | 0 |
| 223 | 0xDF | 0010010000010010 | 2 | -4 | 0 |
| 224 | 0xE0 | 0001001000010010 | 2 | -4 | 0 |
| 225 | 0xE1 | 0000100100010010 | 2 | -4 | 0 |
| 226 | 0xE2 | 0000010010010010 | 2 | -4 | 0 |
| 227 | 0xE3 | 0000000001000001 | 2 | -4 | 0 |
| 228 | 0xE4 | 0010010000001001 | 2 | -4 | 0 |
| 229 | 0xE5 | 0001001000001001 | 2 | -4 | 0 |
| 230 | 0xE6 | 0000100100001001 | 2 | -4 | 0 |
| 231 | 0xE7 | 0000010010001001 | 2 | -4 | 0 |
| 232 | 0xE8 | 0000001001001001 | 2 | -4 | 0 |
| 233 | 0xE9 | 0010000100000000 | 1 | -6 | 0 |
| 234 | 0xEA | 0001000010000000 | 1 | -6 | 0 |
| 235 | 0xEB | 0000100001000000 | 1 | -6 | 0 |
| 236 | 0xEC | 0000010000100000 | 1 | -6 | 0 |
| 237 | 0xED | 0000001000010000 | 1 | -6 | 0 |
| 238 | 0xEE | 0000000100001000 | 1 | -6 | 0 |
| 239 | 0xEF | 0000000010000100 | 1 | -6 | 0 |
| 240 | 0xF0 | 0000000001000010 | 2 | -6 | 0 |
| 241 | 0xF1 | 0010001000000000 | 1 | -8 | 0 |
| 242 | 0xF2 | 0001000100000000 | 1 | -8 | 0 |
| 243 | 0xF3 | 0000100010000000 | 1 | -8 | 0 |
| 244 | 0xF4 | 0000010001000000 | 1 | -8 | 0 |
| 245 | 0xF5 | 0000001000100000 | 1 | -8 | 0 |
| 246 | 0xF6 | 0000000100010000 | 1 | -8 | 0 |
| 247 | 0xF7 | 0000000010001000 | 1 | -8 | 0 |
| 248 | 0xF8 | 0000000001000100 | 1 | -8 | 0 |
| 249 | 0xF9 | 0001001000000000 | 1 | -10 | 0 |
| 250 | 0xFA | 0000100100000000 | 1 | -10 | 0 |
| 251 | 0xFB | 0000010010000000 | 1 | -10 | 0 |
| 252 | 0xFC | 0000001001000000 | 1 | -10 | 0 |
| 253 | 0xFD | 0000000100100000 | 1 | -10 | 0 |
| 254 | 0xFE | 0000000010010000 | 1 | -10 | 0 |
| 255 | 0xFF | 0000000001001000 | 1 | -10 | 0 |

FIG. 18

| t | $D_t$ | Next state | $C_t$ | PRECEDING END NRZ | State | CODE WORD DSV | CODE STRING DSV |
|---|---|---|---|---|---|---|---|
| 0 | 0x05 | 1 | 1001000000100100 | 0 | 1 | −4 | −4 |
| 1 | 0xfc | 1 | 1000000000100010 | 0 | 2 | 8 | 4 |
| 2 | 0xf7 | 2 | 0000000010001000 | 1 | 1 | −8 | 12 |
| 3 | 0x84 | 1 | 0100100000000010 | 1 | 2 | −6 | 18 |
| 4 | 0xfa | 2 | 0000100100000000 | 0 | 1 | −10 | 8 |
| 5 | 0x07 | 1 | 1001000000010010 | 0 | 2 | −4 | 4 |
| ... | ... | 2 | ... | | | | |

FIG. 21

| t | $D_t$ | Next state | $C_t$ | PRECEDING END NRZ | State | CODE WORD DSV | CODE STRING DSV | CONNECTION CONDITION |
|---|---|---|---|---|---|---|---|---|
| 0 | 0x05 | 1 | 1001000000100100 | 0 | 1 | -4 | -4 | — |
| 1 | 0xfc | 1 | 1000000000100010 | 0 | 2 | 8 | 4 | CONDITION 3 |
| 2 | 0xf7 | 1 | 0100000000010001 | 1 | 2 | 6 | -2 | CONDITION 3 |
| 3 | 0x84 | 2 | 0000100000000001 | 0 | 2 | 6 | 4 | CONDITION 2 |
| 4 | 0xfa | 2 | 0000100100000000 | 0 | 1 | -10 | -6 | CONDITION 2 |
| 5 | 0x07 | 2 | 0010000100100000 | 0 | 1 | 6 | 0 | CONDITION 3 |
| ... | ... | ... | ... | 1 | ... | | | |

PRIOR ART

PRIOR ART

ENCODING DEVICE, ENCODING METHOD, RECORDING DEVICE, RECORDING METHOD, OPTICAL RECORDING MEDIUM, DECODING DEVICE AND DECODING METHOD

RELATED APPLICATIONS

The present application claims priority to Japanese Patent Application JP 2010-106319 filed in the Japan Patent Office on May 6, 2010.

BACKGROUND OF THE INVENTION

1. Field of the Invention

The present invention relates to an encoding device and method for converting an m-bit data word into an n-bit code word. In addition, the invention relates to a recording device and method for recording a recording code string obtained by encoding and a recording medium. In addition, the invention relates to a decoding device and method for decoding a recording code string.

2. Description of the Related Art

As optical recording media for performing recording/reproduction of a signal by light irradiation, for example, so-called optical discs such as a Compact Disc (CD), Digital Versatile Disc (DVD) or Blu-ray Disc (BD) (registered trademark) have come into wide use.

In the optical discs widely used in the present state, mark edge recording for defining a recording code as Non Return to Zero Inverting (NRZI) and performing recording after conversion into Non Return to Zero (NRZ) code upon recording is performed.

In the optical discs, due to the relationship for obtaining a tracking error signal from a groove, pit, or the like, few low band components of a recording code are necessary. That is, a tracking servo band is lower than a signal band of a recording code. However, if there are many low band components in the recording code, the components of the recording code may be superimposed on the tracking error signal such that the tracking servo characteristics are deteriorated.

Accordingly, in the optical disc of the related art, the low band components of the recording code are suppressed by controlling the absolute value of the Digital Sum Value (DSV) of the recorded NRZ code string to be decreased.

For example, in a CD, an encoding method of using an EFM modulation code, satisfying a limit of a minimum run length d=2 between a 14-bit code word and the next code word, and selecting and inserting predetermined 3 connection bits so as to decrease the absolute value of the DSV of the code string is used.

In a DVD, using a modulation code called EFM Plus, with respect to a certain data word, a code word of a main table and a substitution table which decreases the absolute value of the DSV of the code string is selected and encoded so as to perform DSV control. This modulation code is described, for example, in Kees A. Schouhamer Immink "EFMPlus: THE CODING FORMAT OF THE MULTIMEDIA COMPACT DISC", IEEE Transaction on Consumer Electronics, Vol. 41, Issue 3, August 1995 and International Publication No. 95/22802.

In a BD, a modulation code called 17PP is used, but a DC control bit is periodically defined in a recording data format of the BD. Thus, encoding is performed after the DC control bit of "0" or "1", which decreases the absolute value of the DSV of the code string, is selected.

With respect to an optical disc which is widely used in the present state of the CD, the DVD, the BD and the like, first, as a next-generation optical disc, the present applicant proposes a so-called bulk recording type optical disc (simply referred to as a bulk type) described in Japanese Unexamined Patent Application Publication No. 2008-135144 or Japanese Unexamined Patent Application Publication No. 2008-176902.

Here, bulk recording indicates, for example, a technology of realizing a large amount of recording capacity by irradiating a laser beam to an optical recording medium (bulk type recording medium 100) having at least a cover layer 101 and a bulk layer (recording layer) 102 while sequentially changing a focal point position so as to perform multi-layer recording in the bulk layer 102, as shown in FIG. 26.

In such bulk recording, Japanese Unexamined Patent Application Publication No. 2008-135144 discloses recording technology which is a so-called micro hologram method. In the micro hologram method, a so-called hologram recording material is used as a recording material of the bulk layer 102. As the hologram recording material, for example, a photopolymerizable photopolymer or the like is widely used.

The micro hologram method is classified broadly into a positive type micro hologram method and a negative type micro hologram method.

The positive type micro hologram method is a method of focusing two opposing light fluxes (light flux A and light flux B) at the same position so as to form a minute interference fringe (hologram) and using the minute interference fringe as a recording mark.

The negative type micro hologram method is a method of erasing an interference fringe formed in advance by laser beam irradiation and using the erased portion as a recording mark, in opposition to the positive type micro hologram method. In the negative type micro hologram method, a process for forming an interference fringe in the bulk layer is performed in advance, as an initialization process.

The present applicant proposes, for example, a recording method of forming a void (blank or hole) disclosed in Japanese Unexamined Patent Application Publication No. 2008-176902 as a recording mark, as a bulk recording method different from the micro hologram method.

The void recording method is, for example, a method of irradiating a laser beam to the bulk layer 102 formed of a recording material such as a photopolymerizable photopolymer with relatively high power so as to record a blank in the bulk layer 102. As described in Japanese Unexamined Patent Application Publication No. 2008-176902, the formed blank portion has a refractive index different from that of the other portion of the bulk layer 102 and thus the light reflection ratio of the boundary portion thereof is increased. Accordingly, the blank portion functions as a recording mark and thus information recording by formation of a blank mark is realized.

In such a void recording method, since the hologram is not formed, recording is completed by light irradiation from one side. That is, as in the positive type micro hologram method, it is not necessary to focus two light fluxes at the same position so as to form the recording mark.

In addition, in comparison with the negative type micro hologram method, it is an advantage that the initialization process is not performed.

In Japanese Unexamined Patent Application Publication No. 2008-176902, although an example of irradiating a pre-cure light before recording at the time of performing void recording is described, void recording is possible even when the irradiation of the pre-cure light is omitted.

However, the bulk recording type (also simply referred to as bulk type) optical disc recording medium is proposed as the above various recording methods, but the recording layer (bulk layer) of the bulk type optical disc recording medium does not have an explicit multi-layer structure in the sense that, for example, a plurality of reflection films is formed. That is, in the bulk layer 102, a reflection film and a guide groove are not provided in every recording layer included in a general multi-layer disc.

Accordingly, in the structure of the bulk type recording medium 100 as it is shown in FIG. 26, focus servo and tracking servo may not be performed during recording in which the mark is not formed.

Accordingly, practically, in the bulk type recording medium 100, a reflection surface (reference surface) is provided which becomes a reference having guide grooves shown in FIG. 27.

More specifically, the guide grooves (position guide elements) such as pits or grooves are formed in a lower surface side of the cover layer 101 in a spiral shape or a concentric shape and a selective reflection film 103 is formed on the guide grooves. The bulk layer 102 is laminated on the lower layer side of the cover layer 101, on which the selective reflection film 103 is formed, with an adhesive material interposed therebetween as an intermediate layer 104 in the figure, such as a UV curing resin.

Here, through the formation of the guide grooves such as pits or grooves, for example, recording of absolute position information (address information) such as radius position information or rotation angle information is performed. In the following description, a surface (in this case, a surface on which the selective reflection film 103 is formed) in which such guide grooves are formed and the absolute position information is recorded is referred to as a "reference surface Ref".

After such a medium structure is formed, as shown in the figure, not only a laser beam (hereinafter, referred to as a recording/reproduction laser beam or simply a recording/reproduction light) for recording (or reproducing) a mark but also a servo laser beam (simply referred to as a servo light) as a laser beam for position control is irradiated to the bulk type recording medium 100 through a common objective lens.

At this time, if the servo laser beam reaches the bulk layer 102, the mark recording in the bulk layer 102 may be adversely affected. Accordingly, in the bulk recording method of the related art, the laser beam having a wavelength range different from that of the recording/reproduction laser beam is used as the servo laser beam, and the selective reflection film 103 having wavelength selectivity, which reflects the servo laser beam and transmits the recording/reproduction laser beam, is provided as the reflection film formed on the reference surface Ref.

On the above assumption, the operation at the time of mark recording for the bulk type recording medium 100 will be described. First, when multi-layer recording is performed with respect to the bulk layer 102 in which the guide grooves and the reflection film are not formed, the layer position where the mark is recorded in a depth direction in the bulk layer 102 is set in advance. In the figure, the case where a total of 5 information recording layer positions L including a first information recording layer position L1 to a fifth information recording layer position L5 are set as a layer position (mark forming layer position; also referred to as an information recording layer position) where the mark is formed in the bulk layer 102 is shown. As shown, in the information recording layer position L, the first information recording layer position L1 is provided at an uppermost side and, next, the information recording positions L2, L3, L4 and L5 are sequentially provided toward a lower layer side.

During recording in which the mark is not yet formed, a focus servo control and a tracking servo control are not performed based on the reflected light of the recording/reproduction laser beam with respect to the layer positions in the bulk layer 102 as a target. Accordingly, the focus servo control and the tracking servo control of the objective lens during recording are performed so as to enable the spot position of the servo laser beam to follow the guide grooves on the reference surface Ref based on the reflected light of the servo laser beam.

It is necessary for the recording/reproduction laser beam to reach the bulk layer 102 formed on the lower layer side of the selective reflection film 103 than the reference surface Ref and to select the focusing position in the bulk layer 102, for mark recording. To this end, in an optical system in this case, a focus mechanism (expander) for the recording/reproduction light is provided, which independently adjusts a focusing position of the recording/reproduction laser beam, separately from the focus mechanism of the objective lens.

That is, the focusing position of the recording/reproduction laser beam is adjusted independently of the servo laser beam, by changing collimation of the recording/reproduction laser beam incident to the objective lens by the provided expander.

The position of the recording/reproduction laser beam in the tracking direction is automatically controlled to a position just below the guide grooves in the reference surface Ref by the tracking servo of the objective lens using the above servo laser beam.

In addition, when reproduction is performed with respect to the bulk type recording medium 100 in which mark recording is already performed, it is not necessary to control the position of the objective lens based on the reflected light of the servo laser beam, as during recording. That is, during reproduction, focus servo control and tracking servo control of the objective lens based on the reflected light of the recording/reproduction laser beam are performed, using a mark row formed at the information recording layer position L (also referred to as an information recording layer L or a mark formation layer L, during reproduction) to be reproduced as a target.

SUMMARY OF THE INVENTION

As described above, in the optical disc system of the related art, the low band of the recording code is suppressed by controlling the absolute value of the Digital Sum Value (DSV) of a recorded NRZ code string so as to be decreased.

However, in the encoding method using the connection bits as in the CD, since 8 bits are converted into 17 bits, an encoding rate is 8/17, which is lower than an encoding rate 1/2=0.5 of the code of d=2 which is generally recognized as 27RLL or the like. Thus, recording capacity efficiency is decreased.

In the DVD, the code word of the main table and the substitution table which decreases the absolute value of the DSV of the code string is selected and encoded with respect to any given data word so as to perform DSV control. Since the encoding rate of EFM Plus is 8/16=0.5, it is improved as compared to EFM. However, since a code transition state is also added to a sliding block code, error propagation may occur in a decoding process when channel bit detection error occurs.

In the BD, the modulation code called 17PP is used, but a DC control bit is periodically defined in a recording data format of the BD. Thus, encoding is performed after the DC control bit of "0" or "1" is selected at one timing at 45 bits of data so as to decrease the absolute value of the DSV of the code string. The encoding rate of 17PP is 2/3 which is equal to that of general code of d=1, but DC control bits are necessary. To this end, since conversion efficiency including a format becomes (45/46)×(2/3), recording capacity efficiency is also decreased.

The invention is made to solve encoding rate deterioration and error propagation upon decoding and, more particularly, it is desirable to provide an encoding method suitable for a bulk recording method (multi-layer recording) for performing mark edge recording.

According to an embodiment of the present invention, there is provided an encoding device for converting m-bit data words into n-bit (both n and m are integers and $2^n \geq 2^m \times 2$) code words, including a first encoding table in which $2^m$ code words selected from the $2^n$ n-bit code words correspond to $2^m$ m-bit data words, a second encoding table in which $2^m$ code words, which do not overlap with the code words in the first encoding table, of the $2^n$ n-bit code words correspond to $2^m$ m-bit data words, and an encoding unit which selects and outputs a code word, in which an absolute value of a code string DSV is smaller, from code words corresponding to the input m-bit data words in the first encoding table and code words corresponding to the input m-bit data words in the second encoding table.

Code words in which the number of symbols "1" is an odd number in the second encoding table may correspond to data words to which code words in which the number of symbols "1" is an even number correspond to the first encoding table, and code words in which the number of symbols "1" is an even number in the second encoding table may correspond to data words to which code words in which the number of symbols "1" is an odd number correspond to the first encoding table.

In any one set of code words in which the number of symbols "1" is an even number in the first encoding table and a set of code words in which the number of symbols "1" is an odd number in the second encoding table, the code words may be aligned in ascending order of code word DSV when the code words are NRZ-converted so as to correspond to the data words, and, in the other of the sets, the code words may be aligned in descending order of code word DSV when the code words are NRZ-converted so as to correspond to the data words, and, in any one set of code words in which the number of symbols "1" is an odd number in the first encoding table and a set of code words in which the number of symbols "1" is an even number in the second encoding table, the code words may be aligned in ascending order of code word DSV when the code words are NRZ-converted so as to correspond to the data words, and, in the other of the sets, the code words may be aligned in descending order of code word DSV when the code words are NRZ-converted so as to correspond to the data words.

The encoding unit may select the code words such that a run length limitation of a shortest 0 consecutive length d (d≠0) and a longest 0 consecutive length k (k>d) of a code string obtained from the encoding result is satisfied.

The encoding unit may respectively convert the input m-bit data word into a first code word and a second code word by the first encoding table and the second encoding table, and determine whether both the first code word and the second code word satisfy the run length limitation when the first code word and the second code word are connected to a code word output at one preceding time and select and output a code word in which the absolute value of the code string DSV of the first code word and the second code word is smaller if both the first code word and the second code word satisfy the run length limitation.

For example, d=2, k=10, encoding rate is m/n=1/2, m=8 and n=16.

According to another embodiment of the present invention, there is provided an encoding method for converting m-bit data words into n-bit (both n and m are integers and $2^n \geq 2^m \times 2$) code words, including selecting and outputting a code word, in which an absolute value of a code string DSV is smaller, from code words corresponding to the input m-bit data words in a first encoding table in which $2^m$ code words selected from the $2^n$ n-bit code words correspond to $2^m$ m-bit data words and code words corresponding to the input m-bit data words in a second encoding table in which $2^m$ code words, which do not overlap with the code words in the first encoding table, of the $2^n$ n-bit code words correspond to $2^m$ m-bit data words.

According to another embodiment of the present invention, there is provided a recording device including a recording unit which performs recording with respect to an optical recording medium based on the code words output from an encoding unit, in addition to a first encoding table, a second encoding table and the encoding unit.

The recording unit may record NRZ data obtained by performing inverting to a symbol "1" and non-inverting to a symbol "0" with respect to an encoded string of code words encoded by the encoding unit in the optical recording medium.

The optical recording medium may be a bulk type optical recording medium having a bulk layer for selectively performing mark recording at a plurality of positions in a depth direction, and the recording unit may record marks by a blank in the bulk layer.

According to another embodiment of the present invention, there is provided a recording method including performing recording with respect to an optical recording medium based on code words output by the encoding procedure, in addition to the encoding procedure of the encoding method.

According to another embodiment of the invention, there is provided a bulk type optical recording medium having a bulk layer for selectively performing mark recording at a plurality of positions in a depth direction, wherein a mark row is recorded in the bulk layer based on code words obtained by performing an encoding process of selecting and outputting a code word, in which an absolute value of a code string DSV is smaller, from code words corresponding to the m-bit data words in a first encoding table in which $2^m$ code words selected from the $2^n$ n-bit code words correspond to $2^m$ m-bit data words and code words corresponding to the m-bit data words in a second encoding table in which $2^m$ code words, which do not overlap with the code words in the first encoding table, of the $2^n$ n-bit code words correspond to $2^m$ m-bit data words.

The mark row recorded in the bulk layer may be a mark row based on NRZ data obtained by performing inverting to a symbol "1" and non-inverting to a symbol "0" with respect to an encoded string of encoded code words.

The mark row recorded in the bulk layer may be a mark row by marks formed by blanks.

According to another embodiment of the present invention, there is provided a decoding device including a decoding unit which includes first and second decoding tables in which code words and data words have the same correspondence as first and second encoding tables and searches both a first decoding table and a second decoding table for m-bit data words corresponding to input n-bit code words and outputs the m-bit data words.

According to another embodiment of the invention, there is provided a decoding method including searching both a first decoding table and a second decoding table for m-bit data words corresponding to input n-bit code words and outputting the m-bit data words.

In the encoding of the invention, a first encoding table in which $2^m$ code words selected from the $2^n$ n-bit code words correspond to $2^m$ m-bit data words and a second encoding table in which $2^m$ code words, which do not overlap with the code words in the first encoding table, of the $2^n$ n-bit code words correspond to $2^m$ m-bit data words are prepared. The encoding process of selecting and outputting a code word, in which an absolute value of a code string DSV is smaller, from code words corresponding to the input m-bit data words in the first encoding table and code words corresponding to the input m-bit data words in the second encoding table is performed.

If a run length limitation is considered, there is a limitation as to which of the first and second encoding tables the code word is extracted from in data words at any given time. However, if the run length limitation is satisfied even when the code word is extracted from any given table, the code words may be arbitrarily selected. In this case, by selecting the code word in which the code string DSV is close to zero, it is possible to perform DSV control.

In order to suitably perform DSV control, in the invention, the first and second encoding tables have the following characteristics.

The code words of the first and second encoding tables are all independent and the code words do not overlap with each other.

In the first and second encoding tables, the number of symbols "1" is an odd number in one of the code words corresponding to the same data word and the number of symbols "1" is an even number in the other of the code words corresponding to the same data word. Therefore, the two code words corresponding to the same data word become the code words of a direction in which the code string DSV is increased and a direction in which the code string DSV is decreased.

The code words corresponding to the data words may be aligned in descending order of code word DSV in one of the first and second encoding tables, and may be aligned in ascending order of code word DSV in the other of the first and second encoding tables. That is, the two code words corresponding to the same data word are closer to the absolute value of DSV in the first and second encoding tables.

According to the invention, it is possible to perform encoding such that the code string DSV is as close to zero as possible. In the case of employing a bulk recording method for performing multi-layer recording by mark edge recording in a bulk layer, it is possible to perform suitable encoding. As a result, it is possible to realize reproduction stabilization of the bulk type recording medium.

In the invention, since the code words stored in the first encoding table and the second encoding table do not overlap with each other, so-called error propagation in which a decoding error of one preceding time causes error in a next decoding result does not occur.

According to the decoding device (and decoding method) of the invention, it is possible to suitably and easily decode the code string obtained by encoding of the invention and, as a result, to realize decoding without error propagation.

BRIEF DESCRIPTION OF THE DRAWINGS

FIG. 6 is a view illustrating an example of an S1 encoding table according to an embodiment of the invention;

FIG. 7 is a view illustrating an example of an S1 encoding table according to an embodiment of the invention;

FIG. 8 is a view illustrating an example of an S1 encoding table according to an embodiment of the invention;

FIG. 9 is a view illustrating an example of an S1 encoding table according to an embodiment of the invention;

FIG. 10 is a view illustrating an example of an S2 encoding table according to an embodiment of the invention;

FIG. 11 is a view illustrating an example of an S2 encoding table according to an embodiment of the invention;

FIG. 12 is a view illustrating an example of an S2 encoding table according to an embodiment of the invention;

FIG. 13 is a view illustrating an example of an S2 encoding table according to an embodiment of the invention;

FIG. 18 is a view illustrating an encoding example according to a comparative example;

FIG. 21 is a view illustrating an encoding example according to an embodiment of the invention;

DESCRIPTION OF THE PREFERRED EMBODIMENTS

Hereinafter, embodiments of the invention will be described in the following order.
1. Configuration of Recording/reproduction Device and Optical Recording Medium
2. Encoding Table
3. Comparative Example (the case where DSV control is not performed)

4. Encoding Process of Embodiment
5. Decoding Process
6. Effect of Embodiment and Modified Example

Figure 1:
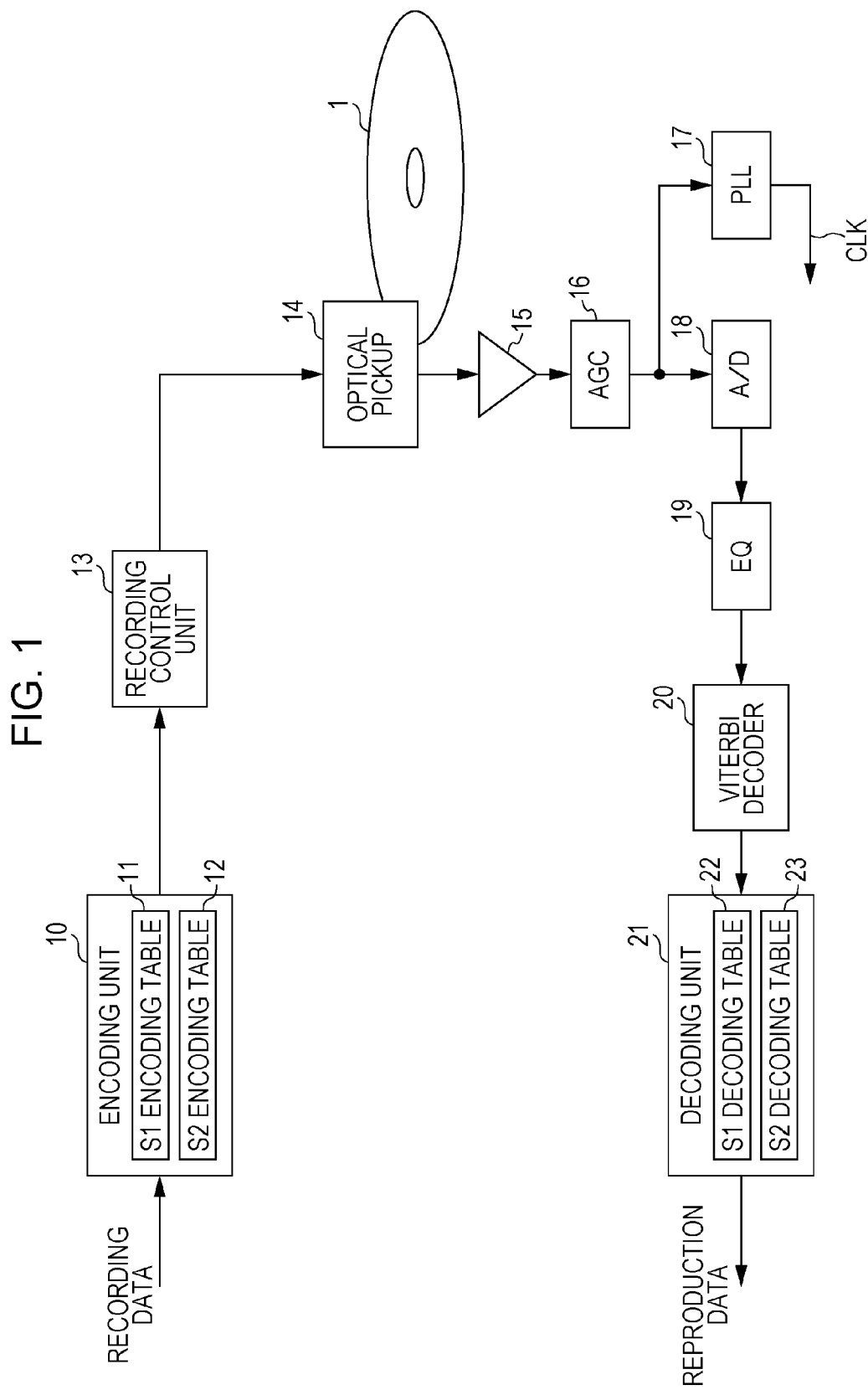
FIG. 1 is a block diagram showing the configuration of a recording/reproduction device according to an embodiment of the invention.

1. Configuration of Recording/Reproduction Device and Optical Recording Medium FIG. 1 is a diagram showing the internal configuration of a recording/reproduction device according to an embodiment of the invention.

Figure 27:
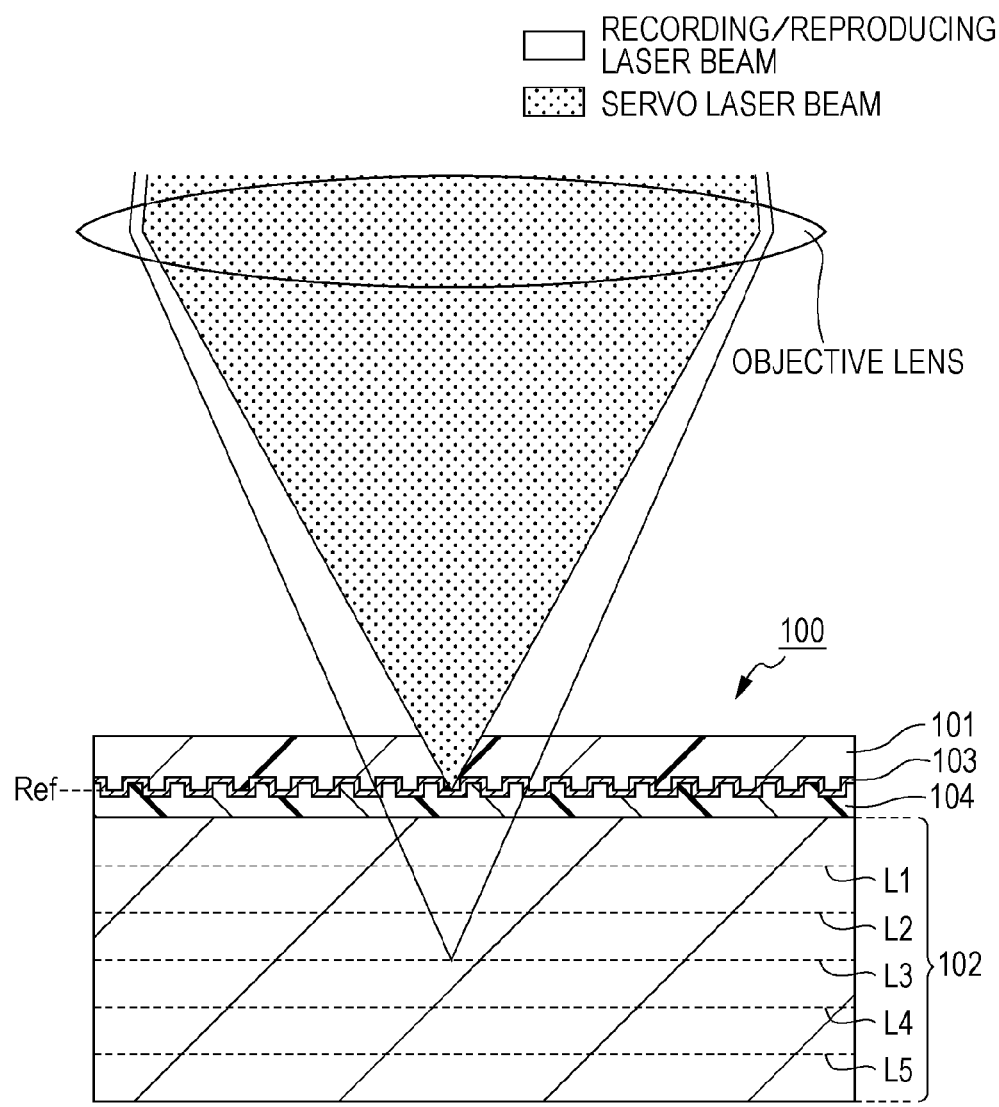
FIG. 27 is a view showing the cross-sectional structure of a bulk type recording medium and servo control upon recording/reproduction.

First, a bulk type recording medium 1 of the figure is a bulk type optical recording medium having a recording layer as a bulk layer, similar to the description of FIG. 27.

The bulk type recording medium 1 is a disc-shaped optical recording medium, in which mark recording (information recording) is performed by irradiating a laser beam to the rotated and driven bulk type recording medium 1. Reproduction of the recording information is also performed by irradiating a laser beam to the rotated and driven bulk type recording medium 1.

The optical recording medium is the generic term for a recording medium for recording/reproduction information by light irradiation.

Figure 2:
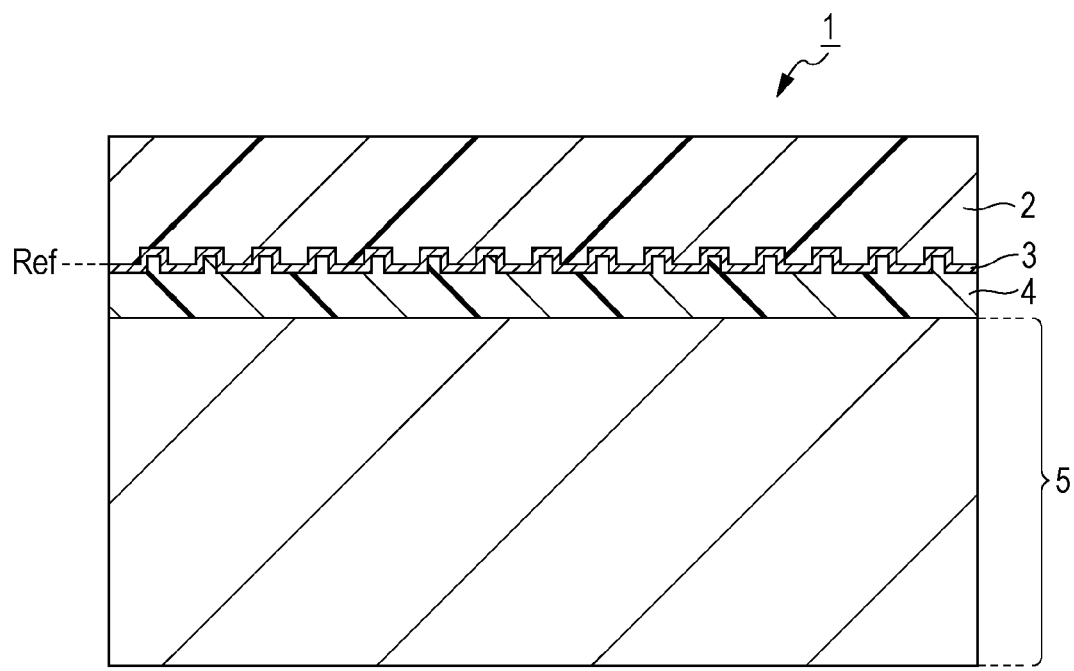
FIG. 2 is a cross-sectional structural diagram of an optical recording medium of an embodiment of the invention.

FIG. 2 is a cross-sectional structural diagram of the bulk type recording medium 1.

As shown in FIG. 2, in the bulk type recording medium 1, a cover layer 2, a selective reflection film 3, an intermediate layer 4, and a bulk layer 5 are sequentially formed from an upper layer side.

In the present specification, the "upper layer side" indicates an upper layer side when a light incident surface side of a device for irradiating a laser beam in order to perform recording or reproduction is an upper surface.

Although the term "depth direction" is used in the present specification, the term "depth direction" indicates a direction matched to a vertical direction according to the definition of the "upper layer side" (that is, a direction parallel to the incident direction of the laser beam from the device side: focus direction).

In the bulk type recording medium 1, the cover layer 2 is formed of, for example, resin such as polycarbonate or acrylic and, as shown, a lower surface side thereof has an uneven cross-sectional shape as shown in the figure by forming guide grooves as position guide elements for guiding a recording/reproduction position. The position guide elements are formed in a spiral shape or a concentric shape.

As the guide grooves, consecutive grooves or pit rows are formed. For example, if the guide grooves are formed of pit rows, position information (absolute position information: rotation angle information, radius position information, or the like as information indicating a rotation angle position on a disc) is recorded by a combination of the lengths of pits and lands. Alternatively, if the guide grooves are formed of grooves, the grooves are periodically formed in a zigzag (wobble) manner so as to record position information by periodic information of the zigzag.

The cover layer 2 is generated by injection molding or the like using a stamper in which, for example, such guide grooves are formed (uneven shape).

The selective reflection film 3 is formed on a lower surface side of the cover layer 2, in which the guide grooves are formed.

As described above, in a bulk recording method, a light (servo laser beam) for obtaining a tracking or focus error signal based on the above guide grooves is irradiated separately from a light (recording/reproduction laser beam) for performing mark recording/reproduction with respect to the bulk layer 5 as a recording layer.

At this time, if the servo laser beam reaches the bulk layer 5, the mark recording in the bulk layer 5 may be adversely affected. Accordingly, a reflection film having selectivity for reflecting the servo laser beam and transmitting the recording/reproduction laser beam is necessary.

In the bulk recording method of the related art, laser beams having different wavelength ranges are used in the recording/reproduction laser beam and the servo laser beam and, in correspondence therewith, a selective reflection film having wavelength selectivity, which reflects a light having the same wavelength range as the servo laser beam and transmits a light having the other wavelength range, is used as the selective reflection film 3.

In the case of this example, the recording/reproduction laser beam has a wavelength of about 405 nm and the servo laser beam has a wavelength of about 640 nm.

The bulk layer 5 as the recording layer is laminated (adhered) on the lower layer side of the selective reflection film 3 with the intermediate layer 4 interposed therebetween, which is formed of, for example, an adhesive material such as UV curing resin.

As the material (recording material) of the bulk layer 5, an optimal material is appropriately employed, for example, according to the employed bulk recording method such as the above-described positive type micro hologram method, the negative type micro hologram method or the void recording method.

In addition, the mark recording method of the optical recording medium of the invention is not specially limited and a certain method may be employed in the range of the bulk recording method. In the following description, for example, a void (blank) recording method is employed.

In the bulk type recording medium 1 having the above configuration, the selective reflection film 3 in which the position guide elements are formed as the above-described guide grooves becomes a reflection surface which is a reference for performing the position control of the recording/reproduction laser beam based on the servo laser beam, as described below. In this sense, in the embodiment, the surface on which the selective reflection film 3 is formed is hereinafter referred to as a reference surface Ref.

As described in FIG. 27, in the bulk type optical recording medium, in order to perform multi-layer recording within the bulk layer, each layer position (information recording layer position L) in which information recording will be performed is set in advance. Although an illustrated description is omitted, even in the bulk type recording medium 1 according to the present embodiment, a necessary number of information recording layer positions L is set.

Now, detailed examples of each layer position will be described. The information recording layer position L located at an uppermost portion is set to a position of about 100 μm from a front surface (uppermost surface) of the bulk type recording medium 1. An information recording layer position L located at a lowermost portion is set to a position of about 300 μm from the front surface.

Information recording layer positions L between the information recording layer position L of the uppermost portion and the information recording layer position L of the lowermost portion are provided such that an interval between the adjacent information recording layer positions L is 10 μm on an average in consideration of interlayer crosstalk.

In addition, the position of the reference surface Ref is a position of about 50 μm from the front surface and an interval from the reference surface Ref to the information recording layer position L of the uppermost portion becomes about 50 μm.

Description returns to FIG. 1.

In the recording/reproduction device according to the embodiment, an optical pickup 14 for irradiating a recording/reproduction laser beam to the bulk type recording medium 1 is provided.

In the optical pickup 14, a recording/reproduction laser beam source and a servo laser beam source for respectively emitting the recording/reproduction laser beam and the servo laser beam described in FIG. 27 are provided. An objective lens for focusing and irradiating the recording/reproduction laser beam and the servo laser beam to the bulk type recording medium 1 or a biaxial actuator for holding the objective lens which may be driven in a tracking direction and a focus direction are also provided. A spectroscopic element (for example, dichroic prism or the like) for synthesizing the recording/reproduction laser beam and the servo laser beam emitted from the respective light sources on the same axis and guiding the beams to the objective lens and separating the reflected light of the recording/reproduction laser beam and the reflected light of the servo laser beam incident through the objective lens from the bulk type recording medium 1 into different optical paths or a recording/reproduction light receiving unit for receiving the reflected light of the recording/reproduction laser beam and a servo light receiving unit for receiving the reflected light of the servo laser beam are also included.

As described in FIG. 27, a recording/reproduction focus mechanism (expander) for changing collimation of the recording/reproduction laser beam incident to the objective lens is also provided. By providing the recording/reproduction focus mechanism, during recording, it is possible to selectively record marks with respect to the necessary information recording layer position L set in the bulk layer 5, under the condition that focus servo of the objective lens is performed with respect to the reference surface Ref by the servo laser beam.

In practice, in the recording/reproduction device, although a servo circuit for performing control of the irradiation position of the laser beam based on the reflected light of the servo laser beam during recording described in FIG. 27 or irradiation position control of the laser beam based on the reflected light of the recording/reproduction laser beam during reproduction, a slide mechanism of the optical pickup 14, and a spindle motor for rotating and driving the bulk type recording medium 1 are also provided. However, since these components are not directly related to an encoding process or a decoding process of the embodiment, they are not shown and described herein.

In the recording/reproduction device, as components for generating a code string (recording code string) to be recorded in the bulk layer 5, an encoding unit 10, an S1 encoding table 11 and an S2 encoding table 12 are provided.

The encoding unit 10 sequentially converts m-bit data word of input recording data into n-bit code word using the S1 encoding table 11 and the S2 encoding table 12 so as to perform encoding of the recording data.

In addition, the encoding process of the embodiment using the S1 encoding table 11 and the S2 encoding table 12 by the encoding unit 10 will be described again later.

The S1 encoding table 11 and the S2 encoding table 12 are stored in an internal or external memory device of the encoding unit 10.

The recording code string obtained by the encoding process using the encoding unit 10 is supplied to a recording control unit 13.

The recording control unit 13 light emission-drives the above-described recording/reproduction laser beam source in the optical pickup 14 based on the recording code string and executes mark recording in the bulk layer 5.

In this case, the recording control unit 13 performs the Non Return to Zero (NRZ) modulation process performed by an optical disc system of, for example, a Digital Versatile Disc (DVD) or a Blu-ray Disc (BD: registered trademark) of the related art with respect to the recording code string and light emission-drives the recording/reproduction laser beam so as to perform so-called mark edge recording.

In the present example, the recording control unit 13 light emission-drives the recording/reproduction laser beam source such that a mark is recorded in correspondence with an H level ("1") of a pulse when the recording code string is subjected to NRZ modulation and a space is formed in correspondence with an L level ("0").

The reflected light from the mark recorded in the bulk type recording medium 1 is detected by the recording/reproduction light receiving unit in the above-described optical pickup 14 so as to obtain a reproduction signal.

The reproduction signal of the mark row obtained in this way is amplified by an amplifier 15 and gain thereof is adjusted by an Auto Gain Control (AGC) circuit 16.

The reproduction signal passing through the AGC circuit 16 is supplied to a Phase Locked Loop (PLL) circuit 17 and an A/D converter 18 as shown in the figure.

The PLL circuit 17 generates a clock CLK by a PLL process based on the reproduction signal. The clock CLK is supplied to a clock of each necessary unit such as the A/D converter 18.

The A/D converter 18 digitally samples the reproduction signal. The reproduction signal sampled by the A/D converter 18 is supplied to an equalizer (EQ) 19.

The equalizer 19 and a Viterbi decoder 20 are provided in order to binarize the reproduction signal by a so-called Partial Response Maximum Likelihood (PRML) decoding method.

The equalizer 19 performs a PR equalization process with respect to the reproduction signal sampled by the A/D converter 18 according a predetermined PR class (for example, 1:2:2:1, 1:2:2:2:1, or the like) and outputs the processed signal to the Viterbi decoder 20.

The Viterbi decoder 20 performs a Viterbi decoding process with respect to the PR-equalized reproduction signal so as to obtain a binarized reproduction signal.

The binarized reproduction signal (corresponding to the above-described recording code string) obtained by the Viterbi decoder 20 is supplied to a decoding unit 21.

The decoding unit 21 sequentially converts the n-bit data word of the code string as the binarized reproduction signal into m-bit data word using an S1 decoding table 22 and an S2 decoding table 23 so as to obtain a reproduction data row.

In addition, the details of the decoding process using the S1 decoding table 22 and the S2 decoding table 23 by the decoding unit 21 will be described again later.

The S1 decoding table 22 and the S2 decoding table 23 are stored in an internal or external memory device of the decoding unit 21.

Here, the configuration of the recording/reproduction device shown in FIG. 1 is not limited thereto.

For example, although the case of performing the binarization process of the reproduction signal by the PRML decoding process is described, the binarization method of the reproduction signal is not limited thereto.

The PLL process of the generation of the clock CLK may be configured to be realized by, for example, a digital PLL process such as an Interpolated Timing Recovery (ITR) method.

The recording/reproduction device according to the embodiment of the invention has an advantage in the encoding process of generating the recording code string in consideration of the recording and reproducing characteristic of the optical recording medium and in the decoding process of decoding the code string. In particular, encoding in which DSV control is appropriately executed is performed.

This point will be described.

As optical reading characteristics of the optical recording medium such as an optical disc, Modulation Transfer Function (MTF) is well known.

This function has low-pass characteristics having a cutoff in which a spatial frequency of 2·NA/λ or more may not be read, when an aperture ratio of an optical pickup is NA and a laser wavelength is λ. Therefore, upon high-density recording, wave equalization of high band emphasis is performed in order to approach an eye pattern of a desired waveform of a partial response or the like.

However, it is difficult to perform equalization even when any high band emphasis is performed for cutoff.

In an NRZI modulation code having a limitation of a minimum run length d≠0, since at least d "0"s are inserted between 1 indicating inversion and the next 1, it is possible to prevent a channel bit row after NRZ conversion from being inverted every channel clock by a recording control circuit. As a result, by shifting the frequency spectrum of the recording channel bit row to a low band, it is possible to easily pass through the MTF. This is the reason that a modulation code having a limitation d is generally used in the optical disc (the case of mark edge recording).

When timing clock synchronization is performed using the PLL circuit, it is necessary to obtain a phase error signal from a reproduction waveform and a clock edge.

At this time, if the reproduction signal is not inverted at a predetermined time interval, an opportunity to perform PLL synchronization is reduced and clock jitter is increased. Accordingly, it is necessary to provide a limitation k (>d) of a maximum run length.

In addition, as described in the related art, from an object that tracking servo is not influenced, a DC control function for suppressing a low band component to the modulation code having limitations d and k.

For DC control, DSV control of the code string is performed, but, before the description thereof, DSV will be defined herein.

Figure 3:
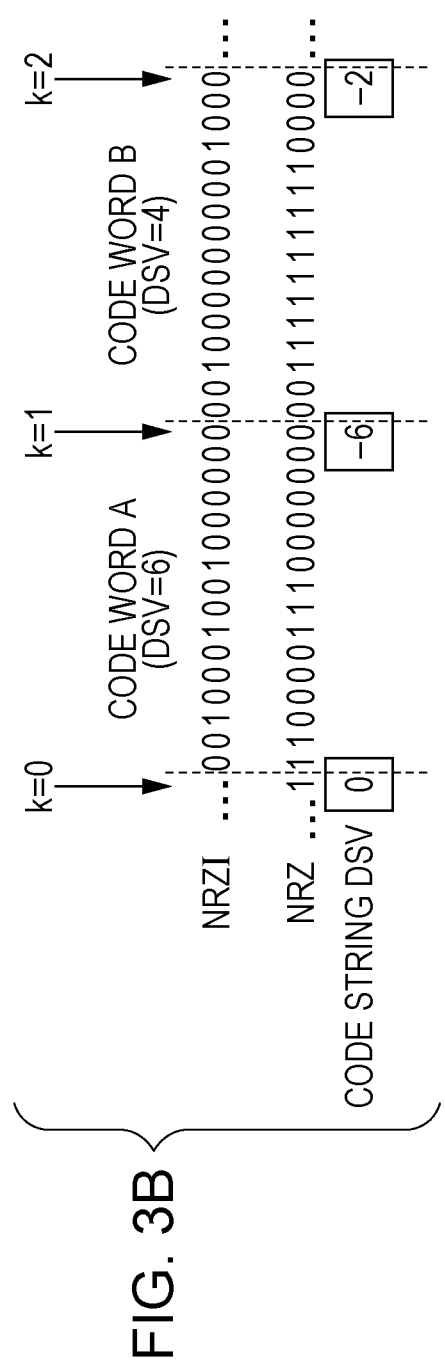
FIGS. 3A and 3B are views illustrating NRZ, NRZI and DSV according to an embodiment of the invention.

As shown in FIG. 3B, an NRZI code string is converted into an NRZ code string converted into a symbol of 1 and is recorded in an optical recording medium.

Here, in NRZ, High (+1) is denoted by 1 and Low (−1) is denoted by 0.

1 of NRZ is +1, 0 of NRZ is −1, and integration thereof is also referred to as "code string DSV".

As shown in FIG. 3A, there is a 16-bit or NRZI code word. NRZ before the code word ends with 0, and the integration value of DSV when the code word is converted into an NRZ code word is referred to as "code word DSV".

In the figure, the code word DSV of the code word A becomes 6. 1 in the case where the NRZI code word A is NRZ converted is +1, 0 is −1, the integration value within the code word is (11-5).

Similarly, the code word DSV of the code word B becomes 4.

For example, the code word DSV=6 of the code word A indicates that, when the code word A is NRZ-converted and a preceding NRZ symbol ends with 0, DSV is increased by 6.

Similarly, when the code word B is NRZ-converted and a preceding NRZ symbol ends with 0, DSV is increased by 4.

However, if the code words A and B are consecutive in the NRZ code string of FIG. 3B, since NRZ=1 at a time k=0, the code string DSV becomes −6 by subtracting (inverting a signal and adding) the code word DSV at k=1. At k=2, since NRZ=0 at k=1, the code string DSV becomes −2 by adding 4 to −6 at k=1.

That is, if the value of preceding NRZ after each code is 0, the code word DSV is added to the preceding code string DSV, and, if the value of the preceding NRZ is 1, the code word DSV is subtracted so as to obtain the code string DSV. Hereinafter, a process of generating a code string of d=2 and k=10 while m=8 bits of data words is converted into n=16 bits of code words will be described.

First, a code word set for generating an encoding table for generating a code string of the invention will be defined, an encoding process of the case where DSV control is not performed will be described, and then an encoding process for performing DSV control will be described.

2. Encoding Table

Now, the S1 encoding table 11 and the S2 encoding table 12 used in encoding of the embodiment will be described.

First, as described above, in the present embodiment, it is assumed that, as encoding of converting m bits (m is an integer of 1 or more) of data word into n bits (n is an integer of 1 or more) code word, encoding of m=8 and n=16 is performed. An encoding rate is m/n=1/2.

In the embodiment, a code string obtained by the encoding result is encoded such that the run length limitation of the shortest 0 consecutive length d (d≠0) and the longest 0 consecutive length k (k>d) is satisfied. More specifically, in this example, the run length limitation satisfies d=2 and k=10. In other words, the consecutive length of symbol "0" is limited to 2 or more and 10 or less.

Figure 4:
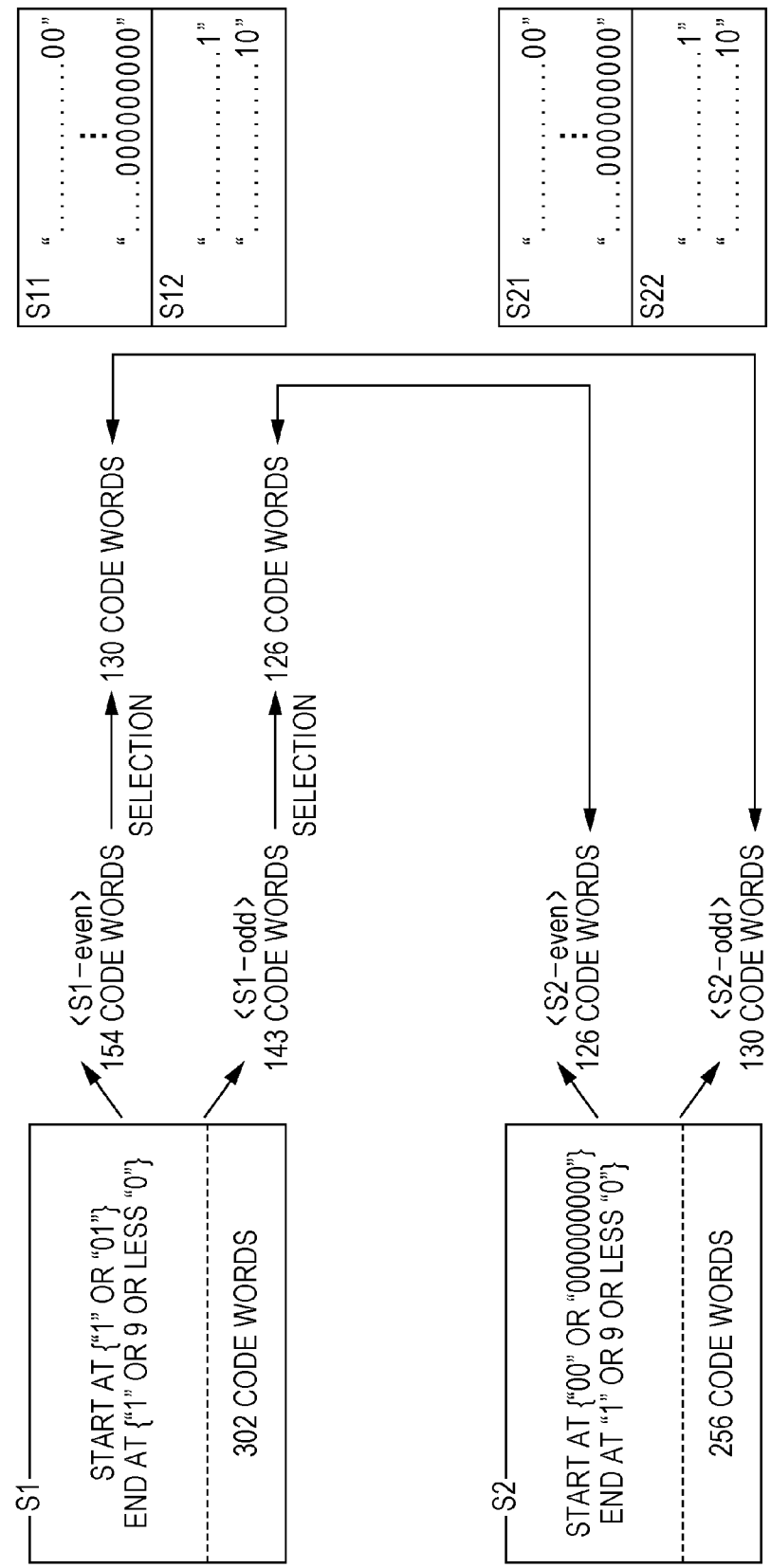
FIG. 4 is a view illustrating classification of code words according to an embodiment of the invention.

On the assumption of such a condition, in this example, the code word stored in the S1 encoding table 11 and the 16-bit code words stored in the S2 encoding table 12 are selected as follows. The following matters are schematically shown in FIG. 4.

First, there are 302 16-bit binary code words, in which a symbol starts at "1" or "01", a run length limitation of d=2 and k=10 is satisfied between symbols "1" midway, and a symbol consecutively ends with "1" or 9 or less "0"s. A set of code words is referred to as S1.

In addition, there are 256 16-bit binary code words, in which a symbol starts at 2 or more and 9 or less "0"s, a run length limitation of d=2 and k=10 is satisfied between symbols "1" midway, and a symbol consecutively ends with "1" or 9 or less "0"s. A set of code words is referred to as S2.

Since m=8, a code word set S2 is assigned to $2^8$=256 kinds of data in one-to-one correspondence.

Among the code words of S1, there are 154 code words in which the number of symbols of "1" is an even number and a set thereof is referred to as S1-even.

Among the code words of S1, there are 148 code words in which the number of symbols of "1" is an odd number and a set thereof is referred to as S1-odd.

Among the code words of S2, there are 126 code words in which the number of symbols of "1" is an even number and a set thereof is referred to as S2-even.

Among the code words of S2, there are 130 code words in which the number of symbols of "1" is an odd number and a set thereof is referred to as S2-odd.

As described below, in this example, upon an encoding process of converting 8-bit data words into 16-bit code words, DSV control is performed by selecting a candidate of a code word of S1 or S2.

It is advantageous that the code word in which the number of symbols of "1" of one candidate is an odd number is assigned to the code word in which the number of symbols of "1" of one candidate is an even number, because the increase/decrease of DSV is reversed.

Therefore, S2-odd corresponds to S1-even and S2-even corresponds to S1-odd as pairs.

Since S2 has no scope for selection from the 256 code words, 130 code words are selected from 154 code words of S1-even and form with pairs of 130 code words of S2-odd. That is, among 256 data words, as 130 code words corresponding to 130 data words, 130 code words included in S1-even are selected from S1 and 130 code words included in S2-odd are selected from S2.

With respect to the code words corresponding to the remaining 126 data words, 126 code words are selected from 143 code words of S1-odd, 126 code words are assigned in S2-even, and they form pairs.

In addition, correspondence is performed such that a value obtained by adding a value of the code word DSV of S1-even and a value of the code word DSV of S2-odd is as close to 0 as possible. Similarly, correspondence is performed such that a value obtained by adding a value of the code word DSV of S1-odd and a value of the code word DSV of S2-even is as close to 0 as possible.

A set of code words in which a symbol ends with consecutive 2 or more and 9 or less "0"s in S1 is S11 and a set of code words which a symbol ends with "1" or "10" is S12.

A set of code words in which a symbol ends with consecutive 2 or more and 9 or less "0"s in S2 is S21 and a set of code words which a symbol ends with "1" or "10" is S22.

Figure 5:
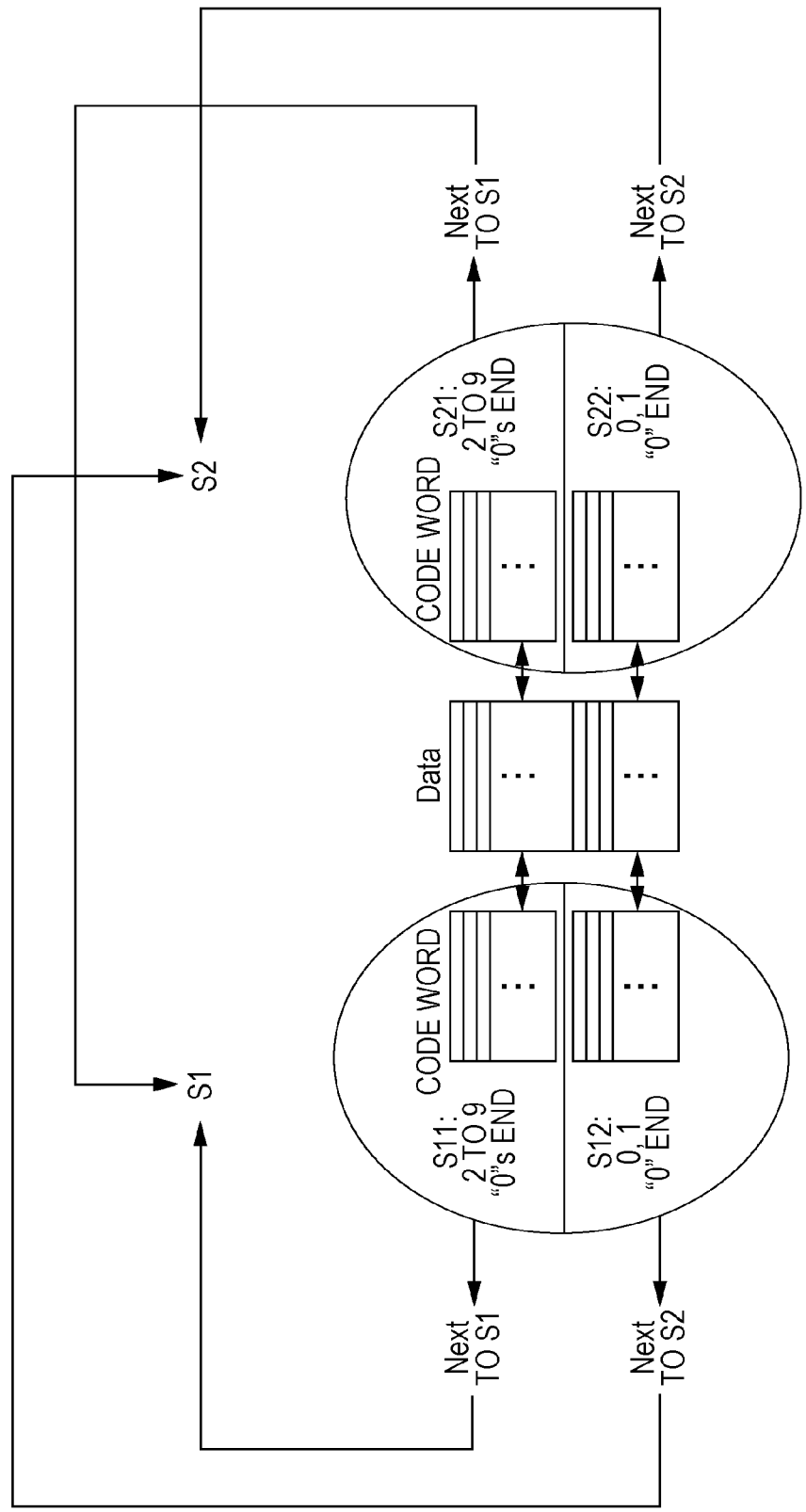
FIG. 5 is a view illustrating the structure of an encoding table according to an embodiment of the invention.

FIG. 5 shows connection between the image of a set of codes of S1 and S2 and data word. There is no overlapping code word in S1 or S2 and there is no overlapping code word in S1 and S2. To this end, it is possible to simply perform decoding upon the below-described decoding.

The S1 encoding table 11 and the S2 encoding table 12 of this example are obtained by assigning code words corresponding to data words based on the above point.

The S1 encoding table 11 stores a set of (256) code words of S1 as code words to be associated with 256 data words.

Similarly, the S2 encoding table 12 stores a set of (256) code words of S2 as code words to be associated with 256 data words.

Examples of the S1 encoding table 11 are shown in FIGS. 6, 7, 8 and 9. Examples of the S2 encoding table 12 are shown in FIGS. 10, 11, 12 and 13.

In FIGS. 6 to 9 and FIGS. 10 to 13, data words of 0 to 255 are shown on the left end. "Data" is a HEX display of data words.

With respect to each data word, 16-bit code words are shown as "Code".

The state of each code word indicates a transition state.

Among the code words of S1 of FIGS. 6 to 9, in S11, "1" is recorded in a next transition state. As shown in FIG. 5, if a code of a certain S1 is connected after this code word, it is indicated that d=2 and k=10 of the code string are typically held.

In S12, "2" is recorded in a next transition state. As shown in FIG. 5, if a code of a certain S2 is connected after this code word, it is indicated that d=2 and k=10 of the code string are typically held.

Among the code words of S2 of FIGS. 10 to 13, in S21, "1" is recorded in a next transition state. As shown in FIG. 5, if a code of a certain S1 is connected after this code word, it is indicated that d=2 and k=10 of the code string are typically held.

In S22, "2" is recorded in a next transition state. As shown in FIG. 5, if a code of a certain S2 is connected after this code word, it is indicated that d=2 and k=10 of the code string are typically held.

In FIGS. 6 to 9 and FIGS. 10 to 13, a code word DSV is shown as "DSV" with respect to each code word.

Further, with respect to each code word, "O/E" indicates that the number of "1"s within the code word is an even number or an odd number. "O/E" of "0" denotes a code word in which the number of "1"s is an even number and "O/E" of "1"s is a code word in which the number of "1"s is an odd number.

That is, in the S1 encoding table 11 of FIGS. 6 to 9, the above-described 130 code words of S1-even have "O/E" of In this example, code words of S1-even may be assigned as 130 code words corresponding to data values "0" to "129".

In contrast, in the S2 encoding table 12 of FIGS. 10 to 13, 130 code words of S2-odd have "O/E" of "1" and may be assigned as code words corresponding to data values "0" to "129".

In addition, in the S1 encoding table 11 of FIGS. 6 to 9, 126 code words of S1-odd have "O/E" of "1" and may be assigned as code words corresponding to data values "130" to "255".

In contrast, in the S2 encoding table 12 of FIGS. 10 to 13, 126 code words of S2-even have "O/E" of "0" and may be assigned as code words corresponding to data values "130" to "255".

The code word DSV of the code words of the S1 encoding table 11 and the S2 encoding table 12 is as follows.

In the data word "0" to "129" of the S1 encoding table 11, the code words having code word DSV of "−4" to "6" may be assigned in descending order of the code word DSV.

In the data words "130" to "255" of the S1 encoding table 11, the code words having code word DSV of "−6" to "8" may be assigned in descending order of the code word DSV.

In the data words "0" to "129" of the S2 encoding table 12, the code words having code word DSV of "6" to "−8" may be assigned in ascending order of the code word DSV.

In the data words "130" to "255" of the S2 encoding table 12, the code word DSV having code words of "6" to "−10" may be assigned in ascending order of the code word DSV.

Figure 14:
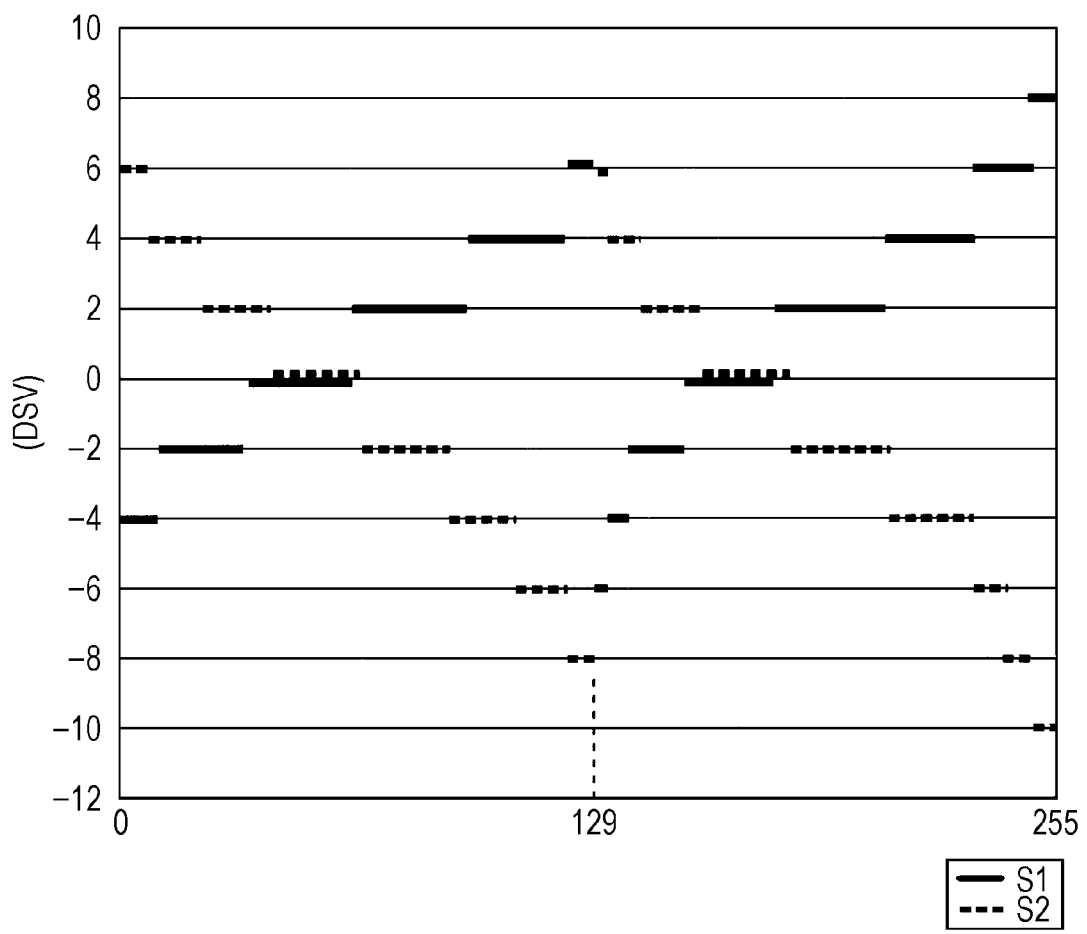
FIG. 14 is a view illustrating ascending and descending order of DSV values of an encoding table according to an embodiment of the invention.

The ascending and descending order state of the code word DSV is shown in FIG. 14.

That is, the code words are selected such that the data words "0" to "255" are aligned in descending order of values of the code word DSV in the S1 encoding table 11 and are aligned in ascending order of values of the code word DSV in the S2 encoding table 12.

Figure 15A:
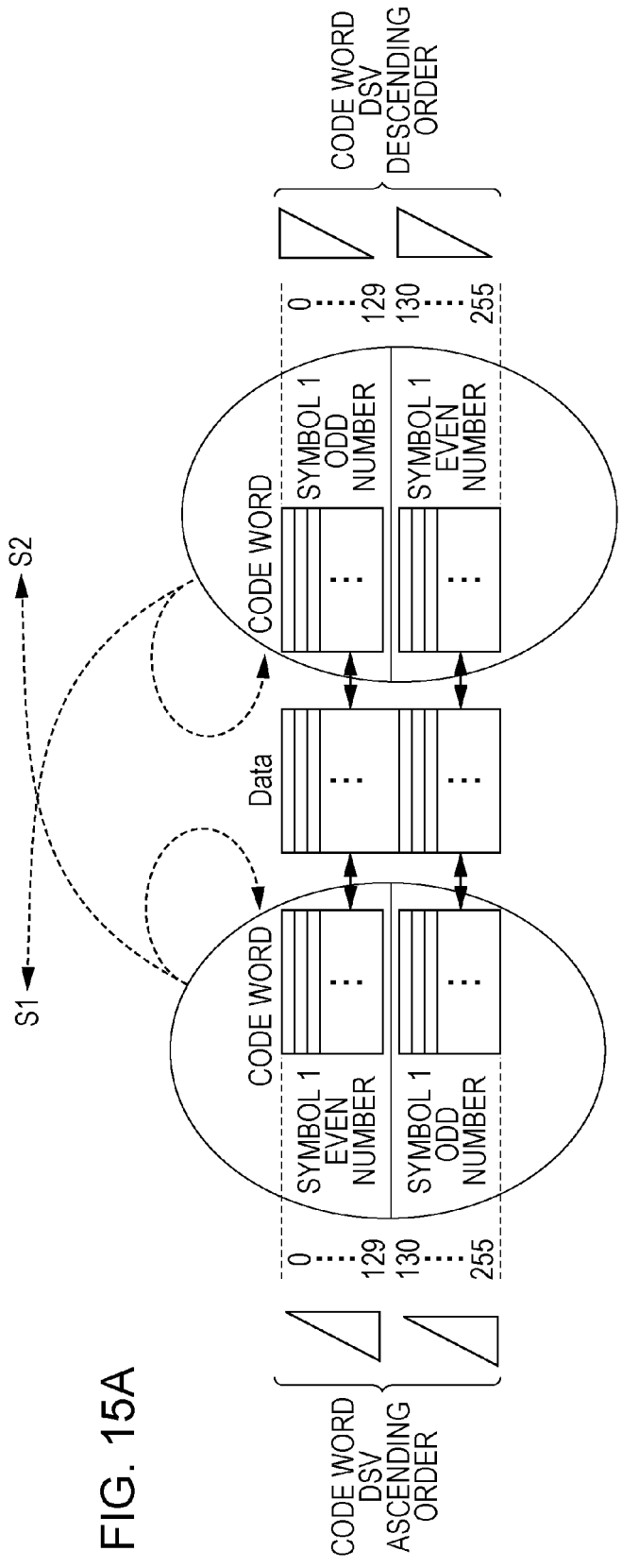
FIGS. 15A and 15B are views illustrating the structure of an encoding table according to an embodiment of the invention.

FIG. 15A schematically shows the structures of the S1 encoding table 11 and the S2 encoding table 12.

In the S1 encoding table 11, the code words of S1-even in which the number of symbols "1" is an even number may be assigned to data words "0" to "129" of the first half. In addition, the order is a descending order of values of the code word DSV.

The code words of S1-odd in which the number of symbols "1" is an odd number may be assigned to data words "130" to "255" of a second half of the S1 encoding table 11. In addition, the order is a descending order of values of the code word DSV.

In the S2 encoding table 12, the code words of S1-odd in which the number of symbols "1" is an odd number may be assigned to data words "0" to "129" of a first half. In addition, the order is an ascending order of values of the code word DSV.

The code words of S1-even in which the number of symbols "1" is an even number may be assigned to data words "130" to "255" of a second half of the S2 encoding table 12. In addition, the order is an ascending order of values of the code word DSV.

In summary, the S1 encoding table 11 and the S2 encoding table 12 have the following characteristics.

First, the code words of the S1 encoding table 11 and the S2 encoding table 12 are all independent and the code words do not overlap with each other. These are tables for converting m-bit data words into n-bit code words, in which n and m are both integers, $2^n \geq 2^m \times 2$, a condition for selecting all independent code words is satisfied in the two tables, and all independent code words are selected.

Next, in the S1 encoding table 11 and the S2 encoding table 12, the number of symbols "1" is an odd number in one of the code words corresponding to the same data word and the number of symbols "1" is an even number in the other of the code words corresponding to the same data word.

Therefore, the two code words of the S1 encoding table 11 and the S2 encoding table 12 corresponding to the same data word become the code words of a direction in which the code string DSV is increased and a direction in which the code string DSV is decreased.

Further, the code words corresponding to the data words may be aligned in a descending order of code word DSV in one of the S1 encoding table 11 and the S2 encoding table, and may be aligned in an ascending order of code word DSV in the other of the S1 encoding table 11 and the S2 encoding table. That is, the two code words corresponding to the same data word are closer to the absolute value of DSV in the S1 encoding table 11 and the S2 encoding table 12.

In addition, in this example, although the S1 encoding table 11 and the S2 encoding table 12 have the above-described characteristics, the relationship between the odd number and the even number and the code word DSV relationship may be reversed.

At least, the number of symbols "1" is an even number in one of the two code words corresponding to one data word and is an odd number in the other of the two code words. The alignment order of values of the code word DSV may be the ascending order in the S1 encoding table 11 and may be the descending order in the S2 encoding table 12.

A description will be given for confirmation. Although "State", "DSV" and "O/E" are shown along with the data words and the code words in FIGS. 6 to 13, the values of "O/E" do not have to be stored in the S1 encoding table 11 and the S2 encoding table 12. "O/E" may be determined from the code words itself by the number of "1".

As described with reference to FIG. 5, "State" is stored in the tables, because the table, from which a code word is next extracted, indicates any one of the S1 encoding table 11 and the S2 encoding table 12, in order to satisfy the run length limitation. However, this is obtained by sequentially confirming the alignment of the symbols "0" and "1" of the code words and does not have to be stored in the tables in advance.

Since the values of the code word DSV of the code words are used when obtaining the code string DSV of the connection state in the below-described connection confirmation (process ST 14 of FIG. 19 and step F205 of FIG. 20), the values of "DSV" are stored in the tables. Since the code word DSV may be easily calculated from the code words, it may be obtained upon processing and does not have to be stored in the tables in advance.

The encoding process of the present embodiment using the S1 encoding table 11 and the S2 encoding table 12 is schematically as follows.

Fundamentally, the run length limitation may be satisfied by determining from which of the S1 encoding table 11 and the S2 encoding table 12 the code word corresponding to the input data word is extracted.

Figure 15B:
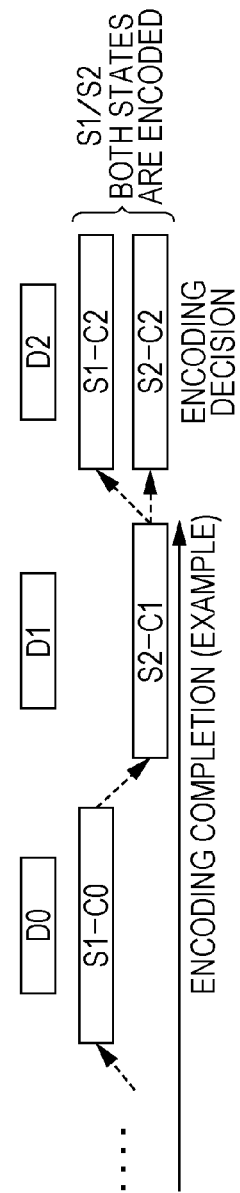

For example, FIG. 15B shows a state in which a data word D0 at a time t0 is encoded into a code word S1-C0 using the S1 encoding table 11. When "State" encounters "2" with respect to the code word S1-C0, a data word D1 of a next time t1 is encoded into S2-C1 using the S2 encoding table 12.

If "State" is "1" with respect to the code word S2-C1, the run length limitation is satisfied when the data word D2 of a next time t2 is encoded into S1-C2 using the S1 encoding table 11. However, even when the data word D2 is encoded into S2-C2 using the S2 encoding table 12, the run length limitation is satisfied. In this case, any one of the S1 encoding table 11 and the S2 encoding table 12 may be used. In the present embodiment, in this case, in consideration of the code string DSV, any one of the S1 encoding table 11 and the S2 encoding table 12 is selected. If the absolute value of the code string DSV is decreased when the data word is encoded into S2-C2 using the S2 encoding table 12, the code word S2-C2 is selected.

3. Comparative Example

Case where DSV Control is not Performed

Now, before the description of the encoding process of the embodiment, as a comparative example, encoding satisfying the run length limitation of d=2 and k=10 using the S1 encoding table 11 and the S2 encoding table 12 will be described. In this method, DSV control is not performed.

Figure 16:
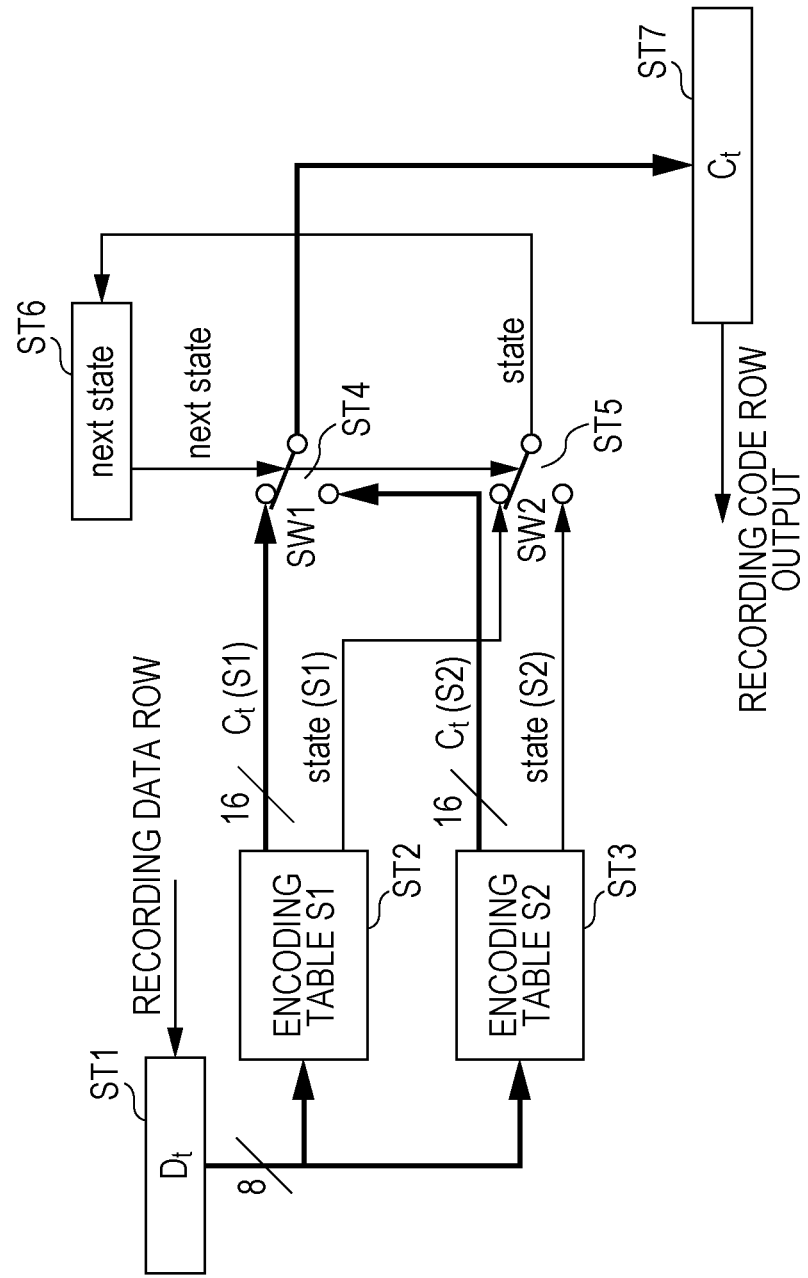
FIG. 16 is a view illustrating an encoding process according to a comparative example.

FIG. 16 shows an internal signal process of the encoding unit 10 when DSV control is not performed, in a block form.

The recording data row is converted into a bus by 8 bits (process ST1).

A data word $D_t$ of a time t (integer) when a data row is increased by 8 bits is delivered to the S1 encoding table 11 and the S2 encoding table 12 through the bus.

By a circuit such as a wired OR (Wired-OR), a table is looked up and a combination $\{C_t(S1), state (S1)\}$ and $\{C_t(S2), state (S2)\}$ of the 16-bit code words corresponding to the data words $D_t$ of the S1 encoding table 11 and the S2 encoding table 12 and the states are output (processes ST2 and ST3).

The next state block is a memory in which one selected from the state (S1) or the state (S2) one preceding time is stored. If the next state signal which is this output is 1, $C_t(S1)$ is selected and output as $C_t$ and state (S1) is output to the next state block.

In contrast, if the next state signal is 2, $C_t(S2)$ is selected and output as $C_t$ and state (S2) is output to the next state block (processes ST4, ST5, ST6 and ST7).

Figure 17:
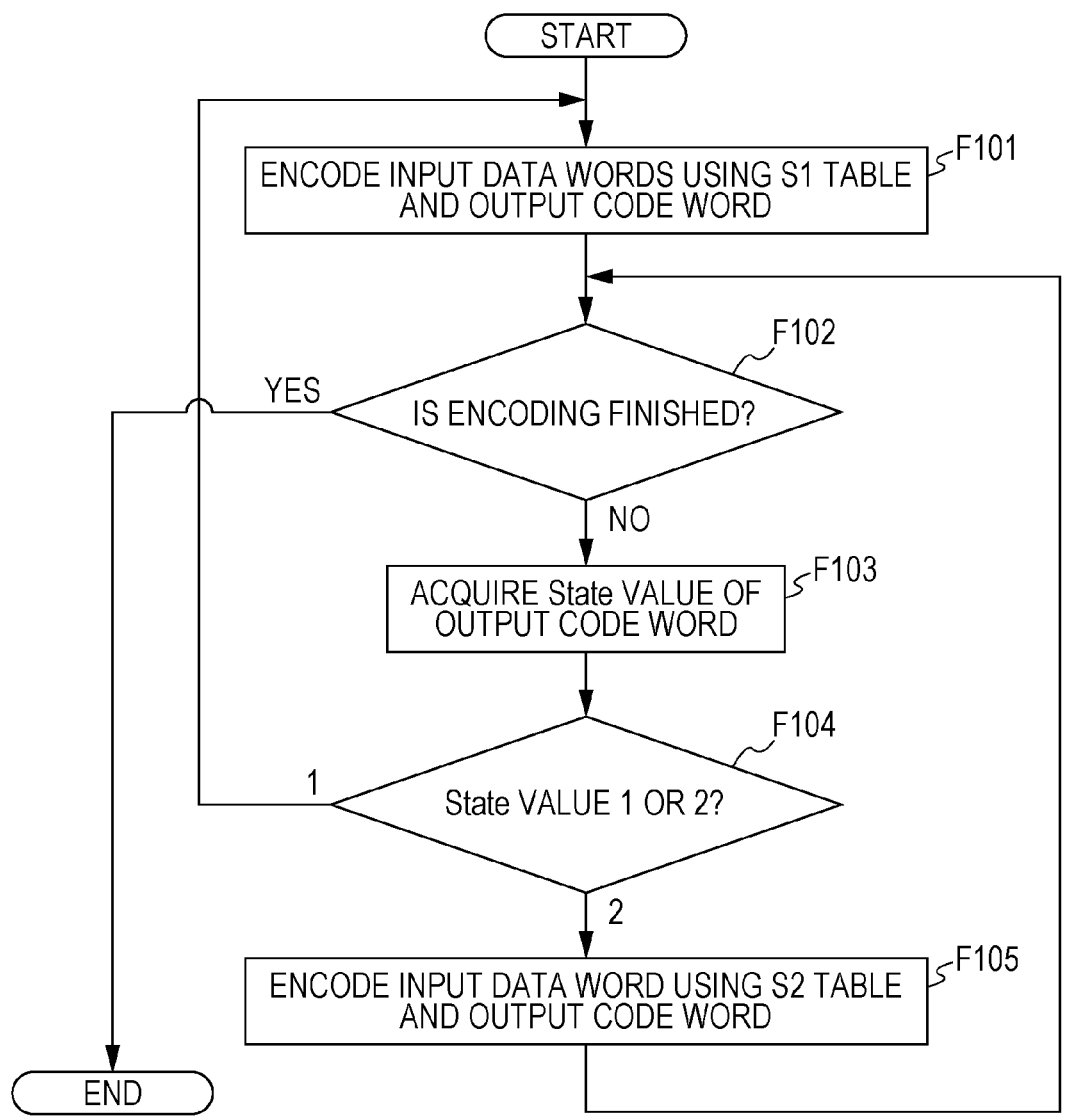
FIG. 17 is a flowchart of an encoding process according to a comparative example.

FIG. 17 is a flowchart illustrating the encoding process of the encoding unit 10 as the comparative example.

First, in step F101, the encoding unit 10 encodes the input data word using the S1 encoding table 11 and outputs the obtained code word.

That is, in this case, a first input data word is encoded by the S1 encoding table 11.

Alternatively, the first input data word may be encoded by the S2 encoding table 12.

In the subsequent step F102, the encoding unit 10 determines whether or not encoding has to be finished (for example, whether or not all data to be recorded is encoded, or the like). If a negative result that encoding does not have to be finished yet is obtained, the process proceeds to step F103.

If a positive result that encoding has to be finished is obtained, the encoding process is finished as shown in the figure.

In step F103, the encoding unit 10 acquires the State value of the output code word and, in the subsequent step F104, a determination as to whether the State value 1 or 2 is made.

In step F104, if it is determined that the State value is 1, the process returns to step F101 of encoding the input data word using the S1 encoding table 11 and outputting the code word.

In contrast, if it is determined that the State value is 2, the process proceeds to step F105 of encoding the input data word using the S2 encoding table 12 and outputting the code word obtained as the result. After the code word is output in step F105, the process returns to step F102 as shown in the figure.

If only the satisfaction of the run length limitations is considered, the next input data word is simply encoded using any one of the S1 encoding table 11 and the S2 encoding table 12 according to the State value of the output code word.

For example, if a data word row is input at a next state=1 of a time t=0, encoding is performed as shown in FIG. 18.

In FIG. 18, t is a time, $D_t$ is a data word of the time t, and $C_t$ is a code word of the time t. The data word of the time t=1 is denoted by "D1" and the code word thereof is denoted by "C1". In addition, the next state becomes the State value of the code word one preceding time. A preceding end NRZ indicates whether the NRZ code of the code word of one preceding time is "0" or "1". Further, it indicates the code word DSV and the code string DSV of each time.

In the example shown in this figure, the input data word at the time 1 is "0x05" at t=0, is "0xfc" at t=1, is "0xf7" at t=2, "0x84" at t=3, is "0xfa" at t=4, and "0x07" at t=5.

For example, first, at the time t=0, the input data word D0="0x05" is encoded using the S1 encoding table 11 and the code word C0 of "1001000000100100" is output. Since the State value of the code word at the time t=0 is "1", the data word D1="0xfc" is encoded using the S1 encoding table 11 and the code word C1 of "1000000000100010" is output.

Further, since the State value of the code word at the time t=1 is "2", the data word D2="0xf7" at the sequential time t=2 is encoded using the S2 encoding table 12 and the code word C2 of "0000000010001000" is output.

As the result of sequentially performing encoding using the S1 encoding table 11 or the S2 encoding table 12 according to the State value, the code string DSV of the times t=0 to 5 sequentially become −4, 4, 12, 18, 8 and 4.

4. Encoding Process of Embodiment

Contrary to the encoding process of the comparative example, in the encoding process of the present embodiment, DSV control is performed. Hereinafter, the present embodiment will be described.

Figure 19:
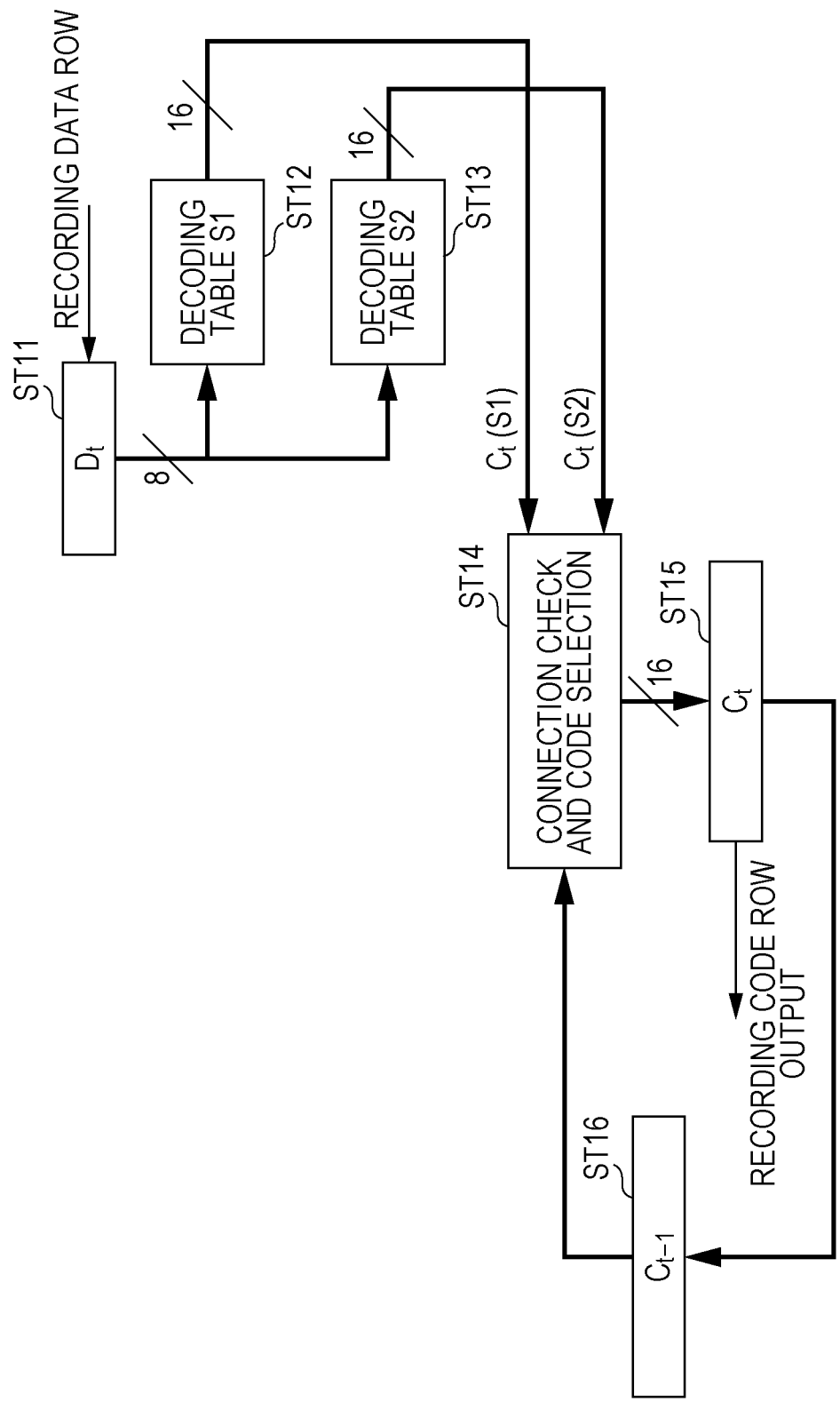
FIG. 19 is a view illustrating an encoding process according to an embodiment of the invention.

FIG. 19 shows an internal signal process of the encoding unit 10 of the embodiment, in which the DSV control is performed, in a block form.

The recording data row is converted into a bus by 8 bits (process ST11). A data word $D_t$ of a time t (integer) when the data row is increased by 8 bits is delivered to the S1 encoding table 11 and the S2 encoding table 12 through the bus.

By a circuit such as a wired OR (Wired-OR), a table is looked up and 16-bit code words $C_t$ (S1) and $C_t$ (S2) corresponding to the data words $D_k$ of the S1 encoding table 11 and the S2 encoding table 12 are output (processes ST12 and ST13).

With respect to the code words $C_t$ (S1) and $C_t$ (S2), it is checked whether or not the connection relationship with the code word $C_t-1$ output at one preceding time satisfies d=2 and k=10 and selects a code word (process ST14). Then the selected code word is output (process ST15). The selected code word is held as the code word $C_t-1$ at one preceding time at the process of a next time (process ST16).

More specifically, the following operations are performed.

First, with respect to the code word $C_t-1$ of one preceding time, when the code words $C_t$ (S1) and $C_t$ (S2) are respectively connected, it is checked whether or not the connection relationship (run length limitation) is satisfied.

Here, in the case where only the code word $C_t$ (S1) satisfies the connection relationship and $C_k$ (S2) does not satisfy the connection relation is referred to as a condition 1.

In the case where the code word $C_t$ (S1) does not satisfy the connection relationship and only $C_t$ (S2) satisfies the connection relation is referred to as a condition 2.

In addition, in the case where both $C_t$ (S1) and $C_t$ (S2) satisfy the connection relationship is referred to as a condition 3.

In the condition 1, $C_t$ (S1) is output as the code word $C_t$ at this time.

In the condition 2, $C_t$ (S2) is output as the code word $C_t$ at this time.

In the condition 3, when each of the code words of $C_t$ (S1) and $C_t$ (S2) is connected to the code string up until that point, one side in which the value of the code string DSV is closer to 0 is selected and is output as the code word $C_t$ at this time.

In addition, when the code word $C_t-1$ ends with a symbol "1" or "10", the condition of d=2 and k=10 is satisfied even when being connected to any code word of the S2 encoding table 12.

In addition, when the code word $C_k-1$ ends with 2 or more and 9 or less "0"s, the condition of d=2 and k=10 is satisfied even when being connected to any code word of the S1 encoding table 11.

Figure 20:
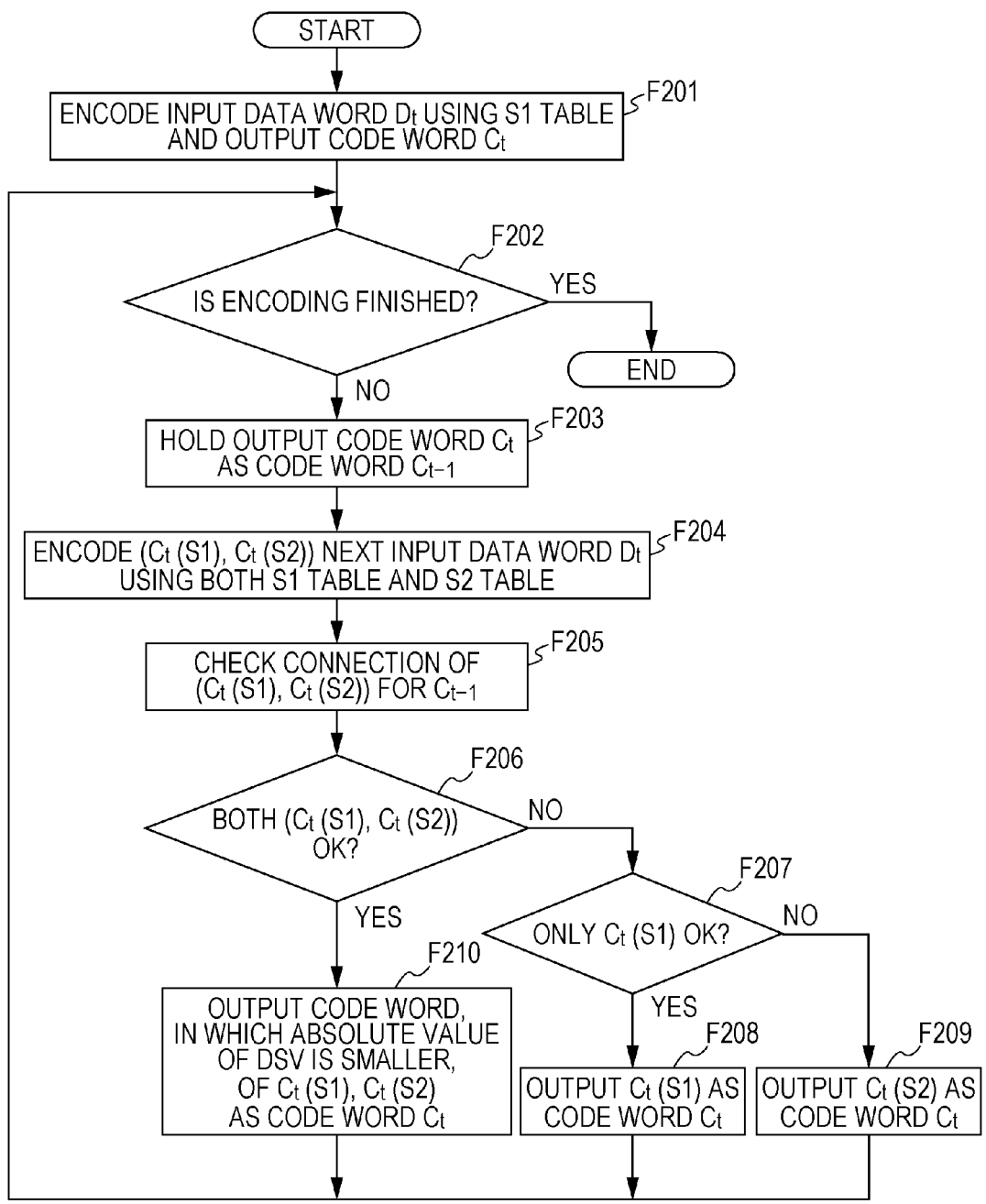
FIG. 20 is a flowchart illustrating an encoding process according to an embodiment of the invention.

That is, this means that any one of the condition 1, the condition 2 and the condition 3 is typically satisfied. Thus, when the encoded string is generated by the above process, the connection relationship is typically held. FIG. 20 is a flowchart illustrating the encoding process of the encoding unit 10 of the embodiment.

First, in step F201, the encoding unit 10 decodes the input data word $D_t$ using the S1 encoding table 11 and outputs the obtained code word $C_t$. In addition, t denotes a time.

Even in this case, the first input data word may be encoded using the S2 encoding table instead of the S1 encoding table 11.

In step F202, the encoding unit 10 determines whether or not encoding has to be finished.

In step F202, if a negative result that encoding does not have to be finished yet is obtained, the encoding unit 10 proceeds to step F203 of holding the output code word $C_t$ as $C_t-1$.

In step F202, if a positive result that encoding has to be finished is obtained, the encoding unit 10 finishes the series of encoding processes shown in this figure.

The encoding unit 10 encodes a next input data word $D_t$ using both the S1 encoding table 11 and the S2 encoding table 12 in step F204, after holding the code word $C_t$ as the code word $C_t-1$ in step F203. Thus, as shown in FIG. 19, the code words $C_t$ (S1) and $C_t$ (S2) are obtained.

In the subsequent step F205, the encoding unit 10 performs a connection checking process of the code words $C_t$ (S1) and $C_t$ (S2) for the code word $C_t-1$. That is, it is checked whether or not the run length limitation is satisfied even when any one of the code words $C_t$ (S1) and $C_2$ (S2) is connected.

In practice, since it may be checked that one side satisfies the run length limitation from the State value of the code word of one preceding time, it is checked whether or not the run length limitation is satisfied with respect to the code word of the other side which is not expressed by the State value.

In next step F206, the encoding unit 10 branches the process depending on whether or not the connection of both the code words $C_t$ (S1) and $C_t$ (S2) is OK, as the checking result.

If any one of $C_t$ (S1) and $C_t$ (S2) does not satisfy the run length limitation, the encoding unit 10 proceeds to step F207 of determining whether or not only the code word $C_t$ (S1) is OK, that is, whether or not only the code string, to which the code word $C_t$ (S1) is connected, satisfies the run length limitation.

If only the code word $C_t$ (S1) is OK, that is, in the above-described condition 1, the encoding unit 10 proceeds to step F208 of outputting the code word $C_t$ (S1) as the code word $C_t$ and then returns to step F202.

If only the code word $C_t$ (S2) is OK, that is, in the above-described condition 2, the encoding unit 10 proceeds to step F209 of outputting the code word $C_t$ (S2) as the code word $C_t$ and then returns to step F202.

In contrast, if the connection of both the code words $C_t$ (S1) and $C_t$ (S2) is OK, that is, in the condition 3, the encoding unit 10 proceeds to steps F206 to F210.

The encoding unit 10 connects each of the code words $C_t$ (S1) and $C_t$ (S2) to the code string up until that point and calculates the value of the code string DSV. A code word in which the code string DSV is closer to 0 (a code word in which the absolute value of the code string DSV is smaller) is selected and is output as the code word $C_t$ at this time. Thereafter, the encoding unit returns to step F202.

By such a process, encoding is performed.

For example, if encoding starts at the code of the S1 encoding table 11 in the case of t=0 and the same data word row as the comparative example in which the DSV control is performed as shown in FIG. 18 is input, encoding is performed as shown in FIG. 21. In FIG. 21, in addition to the same items as FIG. 18, the above-described conditions 1, 2 and 3 are shown as the connection condition.

At the time t=0, it is assumed that Next State=1, preceding end NRZ=0 and code string DSV=0 are set as an initial state.

Since data word D0=0x05, the code word C0 of "1001000000100100" is selected from the S1 encoding table 11. In this case, the code word DSV=−4 and the end NRZ=0 are added to the code string DSV without change so as to become −4.

At the time t=1, the data word D1=0xfc is input. At this time, there are two candidates of the code word C1 (S1) of the S1 encoding table 11 and the code word C1 (S2) of the S2 encoding table 12.

Here, when the code words C1 (S1) and the C1 (S2) are connected, it is determined whether all the conditions 1, 2 and 3 are satisfied. In this case, since the code word C0 of one preceding time ends with two "0"s, the code word C1 (S1) starts with "1" (see FIG. 9), and the code word C1 (S2) starts with 6 "0"s (see FIG. 13), both the code words satisfy d=2 and k=10. Thus, the condition 3 is satisfied.

In this case, a code word in which the absolute value of the code string DSV is smaller is selected as the control of the code string DSV.

In addition, since the number of symbols "1" of the code words of the code word C0 of one preceding time is an even number, the preceding end NRZ is not inverted and is "0" and the code word DSV is added when the code string DSV is obtained.

Since the code word DSV of the code word C1 (S1) is 8 and the code word DSV of the code word C1 (S2) is −10, when they are added to the code string DSV=−4 at the time t=0 and when they are connected to the code word C1 (S1), the code string DSV becomes +4. When the code word C1 (S2) is connected, the code string DSV becomes −14. As a result, since the code word C1 (S1) is closer to 0, the former C1 (S1) is selected as the code word C1 at this time.

At the time t=2, the data word D2=0xf7 is input. At this time, there are two candidates of the code word C2 (S1) of the S1 encoding table 11 and the code word C2 (S2) of the S2 encoding table 12. Since the code word C1 of one preceding time ends with one "0", C2 (S1) starts with one "0" (see FIG. 9), and C2 (S2) starts with eight "0"s (see FIG. 13), both the data words satisfy d=2 and k=10, and, even in this case, the condition 3 is satisfied. Thus, control of the code string DSV is considered.

Since the number of symbols "1" of the code words of the code word C1 of one preceding time is an odd number, the preceding end NRZ is inverted and is "1" and the code word DSV is subtracted when the code string DSV is obtained.

Since the code word DSV of the code word C2 (S1) is 6 and the code word DSV of the code word C2 (S2) is −8, when they are subtracted from the code string DSV=4 at the time t=1 and the code string DSV, to which the code word C2 (S1) is connected, becomes −2. In addition, the code string DSV, to which C2 (S2) is connected, becomes +12. Since the code word C2 (S1) is closer to 0, the former C2 (S1) is selected as the code word C2 at this time.

At the time t=3, the data word D3=0x84 is input. At this time, there are two candidates of the code word C3 (S1) of the S1 encoding table 11 and the code word C3 (S2) of the S2 encoding table 12. Since the code word C2 of one preceding time ends with "1", C3 (S1) starts with one "0" (see FIG. 8), and C3 (S2) starts with four "0"s (see FIG. 12), only C3 (S2) satisfies d=2 and k=10 and the condition 2 is satisfied. Thus, C3 (S2) is selected as the code word C3 at this time.

In this case, since the number of symbols "1" of the code words of the code word C2 of one preceding time is an odd number, the preceding end NRZ is inverted and is "0" and the code word DSV is added when the code string DSV is obtained. Since the code word DSV of the code word C3 (S2) is 6, if it is added to the code string DSV=−2 of the time t=2, the code string DSV of the time t=3 becomes +4.

At the time t=4, the data word D4=0xfa is input. At this time, there are two candidates of the code word C4 (S1) of the S1 encoding table 11 and the code word C4 (S2) of the S2 encoding table 12. Since the code word C3 of one preceding time ends with "1", C4 (S1) starts with "1" (see FIG. 9), and C4 (S2) starts with four "0"s (see FIG. 13), only C4 (S2) satisfies d=2 and k=10 and the condition 2 is satisfied. Thus, C4 (S2) is selected as the code word C4 at this time.

In this case, since the number of symbols "1" of the code words of the code word C3 of one preceding time is an even number, the preceding end NRZ is "0" and the code word DSV is added when the code string DSV is obtained. Since the code word DSV of the code word C4 (S2) is −10, if it is added to the code string DSV=4 of the time t=3, the code string DSV of the time t=4 becomes −6.

At the time t=5, the data word D5=0x07 is input. At this time, there are two candidates of the code word C5 (S1) of the S1 encoding table 11 and the code word C5 (S2) of the S2 encoding table 12. Since the code word C4 of one preceding time ends with eight "0"s, C5 (S1) starts with "1" (see FIG. 6), and C5 (S2) starts with two "0"s (see FIG. 10), both the data words satisfy d=2 and k=10 and the condition 3 is satisfied. Thus, control of the code string DSV is considered.

Since the number of symbols "1" of the code words of the code word C4 of one preceding time is an even number, the preceding end NRZ is "0" and the code word DSV is added when the code string DSV is obtained.

Since the code word DSV of the code word C5 (S1) is −4 and the code word DSV of the code word C5 (S2) is +6, when they are added to the code string DSV=−6 at the time t=4 and the code string DSV, to which the code word C5 (S1) is connected, becomes −10. In addition, the code string DSV, to which C5 (S2) is connected, becomes 0. Since the code word C5 (S2) is closer to +0, the former C5 (S2) is selected as the code word C2 at this time.

For example, as described above, as compared to the case where DSV control is not performed, it may be seen that the code word in which the code string DSV is closer to 0 is selected.

5. Decoding Process

Next, a method of decoding the code string generated by encoding of the above-described embodiment to the data row will be described.

First, according to the definition of the above-described S1 code word set and S2 code word set, in the present embodiment, the same code word is not overlappingly stored in the S1 encoding table 11 and the S2 encoding table 12.

That is, the code words in the S1 encoding table 11 or the S2 encoding table 12 are all independent and the elements of the code words of both the S1 encoding table 11 and the S2 encoding table 12 are all independent. That is, the product set of S1 and S2 does not exist.

This is a large difference that, for example, as in the code of EFM-Plus employed in a DVD system, the same code word exists in the same state and are assigned to the data words according to a next state such that the number of elements (the number of code words) of the code word set is increased.

In the present embodiment, the non-overlapping of the same code word means that the data word is uniquely obtained in two tables of an S1 decoding table 22 and an S2 decoding table 23 respectively corresponding to the S1 encoding table and the S2 encoding table 12, upon decoding.

More specifically, in this case, decoding is performed as follows.

That is, the decoding unit 21 shown in FIG. 1 searches the S1 decoding table 22 and the S2 decoding table 23 and specifies m bits of data words corresponding to the recording code string received from the Viterbi decoder 20 every n bits of code words. Then, the specified data words are sequentially output as reproduction data.

Figure 22:
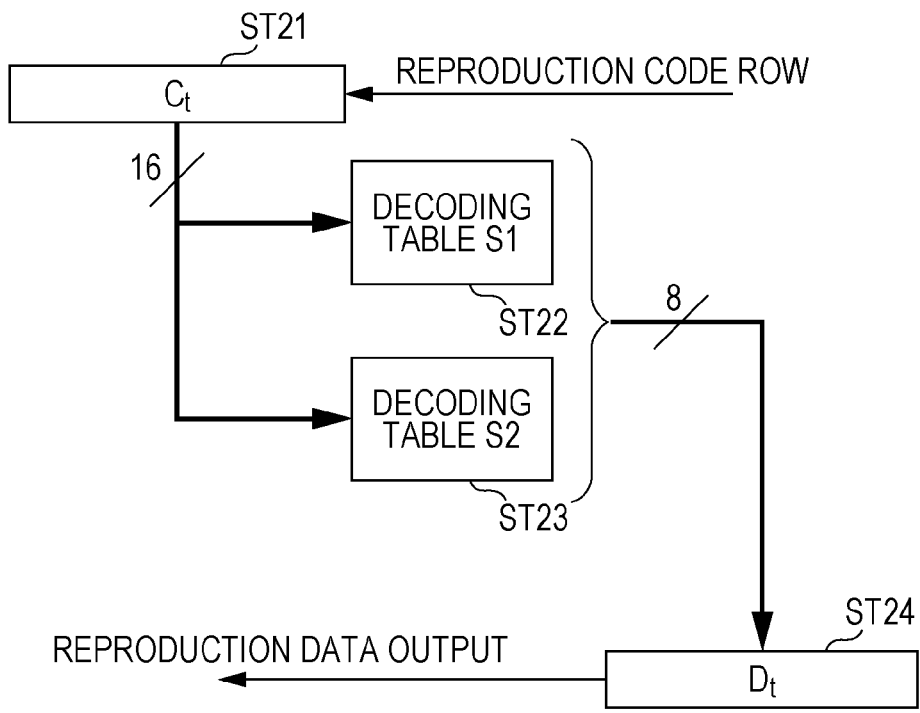
FIG. 22 is a view illustrating a decoding process according to an embodiment of the invention.

FIG. 22 shows the data process of the decoding unit 21 in a block form.

A reproduction code string is obtained by the Viterbi decoder 20 and is converted into a 16-bit bus (process ST21). The code word $C_t$ of the time t (integer) when the code (channel bit) is increased by 16 bits is delivered to the S1 decoding table 22 and the S2 decoding table 23 through the bus (processes ST22 and ST23).

The S1 decoding table 22 and the S2 decoding table 23 reversely reads the combination of the code words and the data words of the S1 encoding table 11 and the S2 encoding table 12 shown in FIGS. 6 to 13 without completely recognizing a next state so as to obtain the data words. As the simplest method, the S1 decoding table 22 and the S2 decoding table 23 may store only the correspondence between the data words and the code words of the S1 encoding table 11 and the S2 encoding table 12.

By a circuit such as a wired OR, a table is looked up and the data words are obtained. The decoding unit 21 refers to the S1 decoding table 22 and the S2 decoding table 23 reads the data word $D_t$ with respect to the code word $C_t$ (process ST24).

Figure 23:
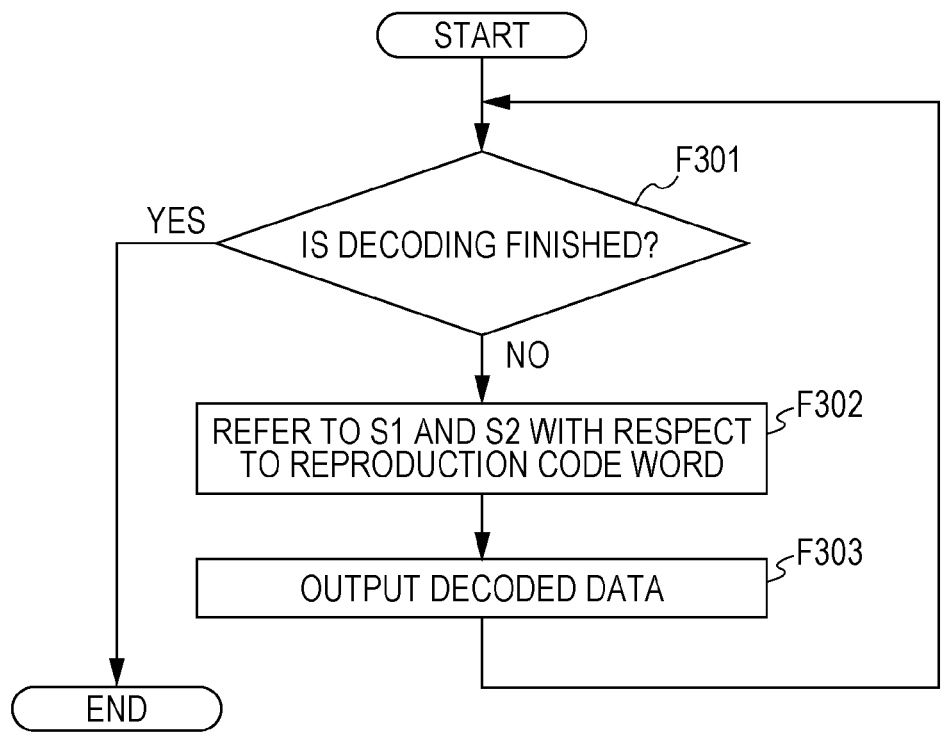
FIG. 23 is a flowchart of a decoding process according to an embodiment of the invention.

Upon encoding, the code words are extracted from any one of the S1 encoding table 11 and the S2 encoding table 12 from the data word $D_t$ and the code words do not overlap. Accordingly, upon decoding, the code word $C_t$ is searched for from the S1 decoding table 22 and the S2 decoding table 23 and the data word $D_t$ corresponding thereto is read. FIG. 23 is a flowchart illustrating the process of the decoding unit 21.

The decoding unit 21 repeats the processes of step F302 and F303 whenever the reproduction code word is input, until it is determined that the decoding is finished in step F301.

In step F302, the S1 decoding table 22 and the S2 decoding table 23 are referred to with respect to the input reproduction code word. In step F303, the data word $D_t$ obtained from the tables is output.

As described above, the S1 encoding table 11 and the S2 encoding table 12 have independent code words. Accordingly, it is possible to obtain unique data words from the S1 decoding table 22 and the S2 decoding table 23 corresponding thereto.

The reproduction data row is obtained by the data word Dk output at each time.

In addition, according to this decoding process, decoding is performed by the completely same circuit, with respect to the code obtained by encoding according to the comparative example, in which DSV control is not performed, and the code obtained by encoding according to the embodiment, in which DSV control is performed.

6. Effect of Embodiment and Modified Example

Up to now, the encoding process and the decoding process of the embodiment have been described.

In the encoding process of the embodiment, in the case where the run length limitation is satisfied, the encoding table used in next encoding is not simply selected according to the State value and DSV control is performed if the run length limitation is satisfied even when any encoding table is selected.

That is, a code word in which the absolute value of the code string DSV is selected in a state in which the code word of each table is connected. Accordingly, it is possible to appropriately perform DSV control.

Figure 24:
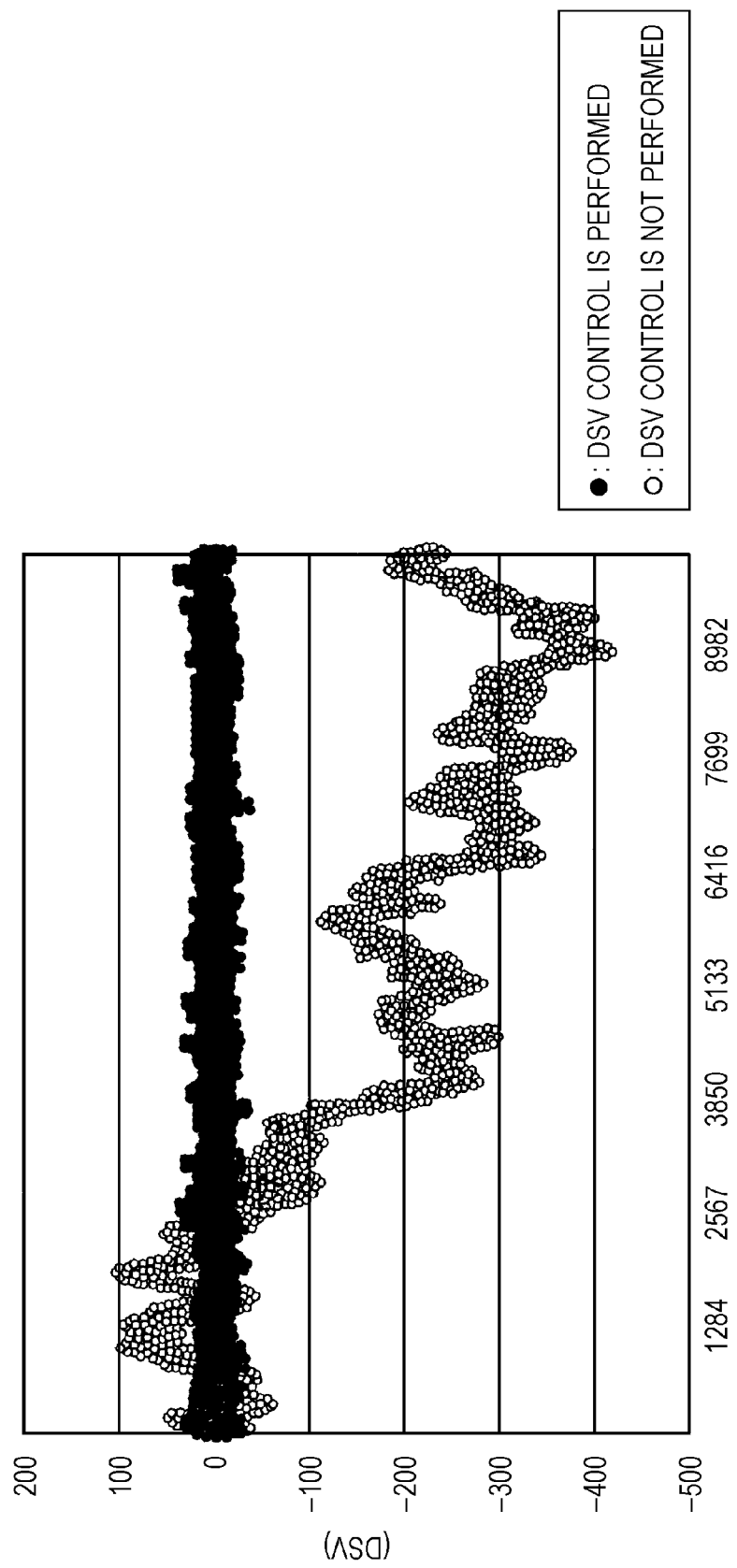
FIG. 24 is a view illustrating a code string DSV when encoding according to an embodiment of the invention is performed.
Figure 25:
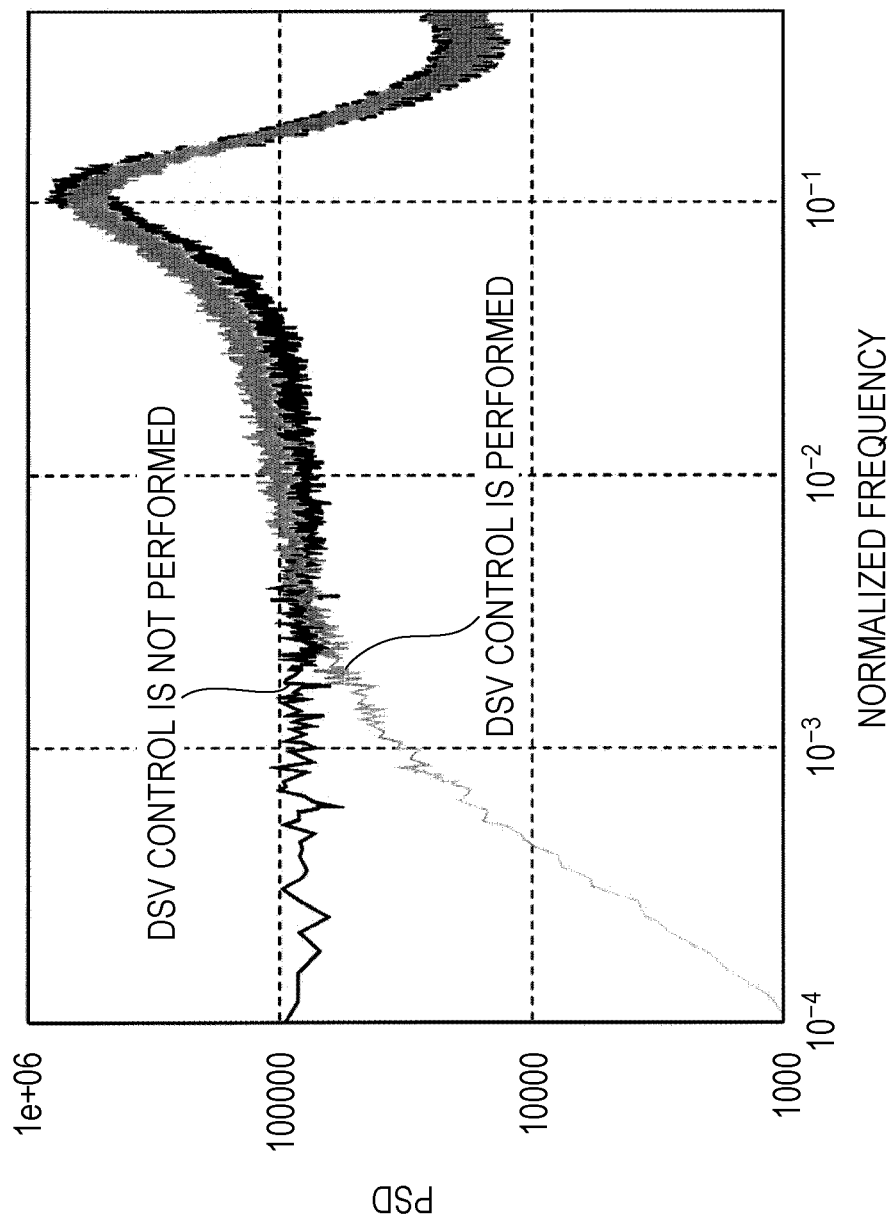
FIG. 25 is a view illustrating low band suppression when encoding according to an embodiment of the invention is performed.
Figure 26:
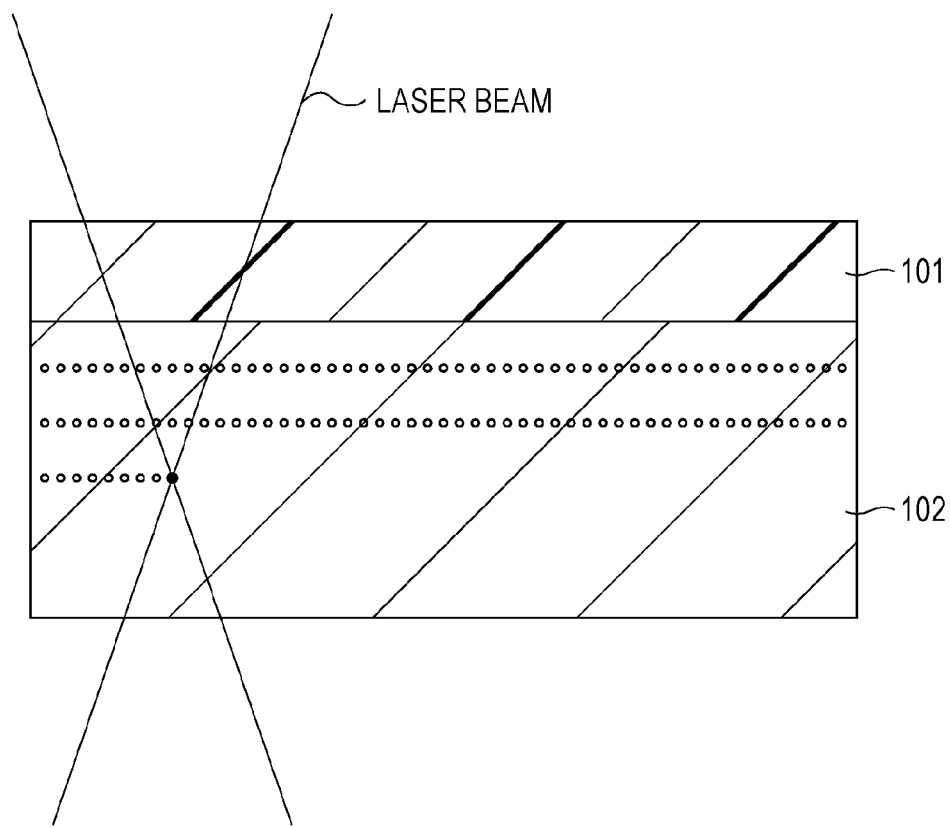
FIG. 26 is a view illustrating a bulk recording method.

The comparison between the code string DSV when the DSV control of the embodiment is performed and the code string DSV when the DSV control is not performed is shown in FIG. 24. The code word DSV when the DSV control is not performed largely oscillates. In contrast, when the DSV control of the present embodiment is performed, the code string DSV is typically close to 0. The comparison between power spectrum densities of the frequency by the code string when DSV control is performed and DSV control is not performed is shown in FIG. 25. The low frequency component is suppressed by DSV control.

In the EFM of the related art or the encoding of 17 PP or the like, it is necessary to add 1 bit for DC control in addition to the limitations d and k of the code. Although there is a problem that capacity efficiency is decreased in order to decrease the encoding rate, according to the encoding process of the present embodiment, it is possible to obtain the same encoding rate as the encoding rate necessary for the limitations d and k.

For example, the encoding and decoding tables of EFM-Plus have four code set states and the lookup tables have 351 or more elements. The number of code set states of the invention is 2 and 256 elements are included. Since they are all included in hardware or a software program, it is possible to reduce the scale of the implementation of the hardware or software by the encoding method of the invention.

In the code of EFM-Plus, overlapping code words exist in the same state, and thus the number of elements of the code word set is increased by assigning the code words to the data words according to a next state. Accordingly, upon decoding, decoding has to be performed according to a previous encoding state. If an error has occurred in the previous decoding, error propagation in which the next decoding is erroneously performed because of the error may occur.

However, in the present embodiment, the code words of the S1 encoding table 11 or the S2 encoding table 12 are all independent and the elements of the code words of the S1 encoding table 11 and the S2 encoding table 12 are all independent. That is, the product set of the S1 encoding table 11 and the S2 encoding table 12 does not exist. Code words correspond one-to-one to data words in the S1 encoding table 11 and the S2 encoding table 12.

To this end, upon decoding using the S1 decoding table 22 and the S2 decoding table 23 including the same correspondence structure between the code words and the data words as the S1 encoding table 11 and the S2 encoding table 12, decoding may be performed without considering the set to which the code word belongs. That is, it is possible to perform decoding in which error propagation does not occur, because it does not depend on the previous state.

Although the embodiments of the invention are described, the invention is not limited to the above-described examples.

For example, the encoding rate is not limited to 8/16. As understood from the above description, in the encoding of this case, as the code words correspond to the same data words in the S1 encoding table 11 and the S2 encoding table 12, at least they do not overlap. In this sense, as the relationship between m and n, at least $2^n \geq 2^m \times 2$ is satisfied.

In the above description, although the run length limitation is d=2 and k=10, the values of d and k are not limited thereto. Even in the run length limitation other than d=2 and k=10, the invention is suitably applicable.

In the above description, in consideration of the run length limitation, with respect to the input data word, the connection between the code words $C_t(S1)$ and $C_t(S2)$ encoded using the S1 encoding table 11 and the S2 encoding table and the code word $C_t-1$ of one preceding time is checked. In addition, only when both $C_t(S1)$ and $C_t(S2)$ satisfy the run length limitation, the code word of a code word in which the code string DSV is closer to zero is selected and output. However, for example, if it is not necessary to provide the run length limitation in order to relatively decrease recording density, for each input of m-bit recording data, sequentially, the code word of a code word, in which the code string DSV is closer to zero, of the code word encoded using the S1 encoding table 11 and the code word encoded using the S2 encoding table 12 may be selected and output.

In the above description, although the case of applying the encoding device (encoding method) or the recording device (recording method) of the invention to the recording/reproduction device which performs both mark recording and reproduction of recording mark with respect to the recording layer is described, the invention is suitably applicable to a recording device (recording dedicated device) for performing only mark recording with respect to a recording layer.

In the above description, although the case of applying the decoding device (decoding method) of the invention to the recording/reproduction device for performing both mark recording and reproduction of recording mark is described, the invention is suitably applicable to a reproducing device (reproduction dedicated device) for performing only reproduction of recorded marks.

In the embodiment, as the recording/reproduction device, the S1 encoding table 11 and the S2 encoding table 12 are included in the encoding unit 10 and the S1 decoding table 22 and the S2 decoding table 23 are included in the decoding unit 21. However, in this case, the S1 encoding table 11 and the S2 encoding table 12 are shared in the decoding unit 21 so as to be used in the decoding process. That is, the S1 decoding table 22 and the S2 decoding table 23 may not be provided separately from the S1 encoding table 11 and the S2 encoding table 12, respectively. In other words, the S1 encoding table 11 and the S2 encoding table 12 may function as the S1 decoding table 22 and the S2 decoding table 23.

The present application contains subject matter related to that disclosed in Japanese Priority Patent Application JP 2010-106319 filed in the Japan Patent Office on May 6, 2010, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An encoding device for converting m-bit data words into n-bit (both n and m are integers and $2^n \geq 2^m \times 2$) code words, the encoding device comprising:
    a first encoding table in which $2^m$ code words selected from $2^n$ n-bit code words correspond to $2^m$ m-bit data words;
    a second encoding table in which $2^m$ code words, which do not overlap with the code words in the first encoding table, of the $2^n$ n-bit code words correspond to $2^m$ m-bit data words; and
    an encoding unit configured to select and output a code word, in which an absolute value of a code string Digital Sum Value is smaller, from code words corresponding to input m-bit data words in the first encoding table and code words corresponding to input m-bit data words in the second encoding table.

2. The encoding device according to claim 1, wherein code words in which a number of symbols "1" is an odd number in the second encoding table correspond to data words to which code words in which a number of symbols "1" is an even number correspond to the first encoding table, and code words in which a number of symbols "1" is an even number in the second encoding table correspond to data words to which code words in which a number of symbols "1" is an odd number correspond to the first encoding table.

3. The encoding device according to claim 2, wherein:
    in any one set of code words in which the number of symbols "1" is an even number in the first encoding table and a set of code words in which the number of symbols "1" is an odd number in the second encoding table, the code words are aligned in ascending order of code word Digital Sum Value when the code words are NRZ-converted so as to correspond to the data words, and, in the other of the sets, the code words are aligned in descending order of code word Digital Sum Value when the code words are NRZ-converted so as to correspond to the data words, and in any one set of code words in which the number of symbols "1" is an odd number in the first encoding table and a set of code words in which the number of symbols "1" is an even number in the second encoding table, the code words are aligned in ascending order of code word Digital Sum Value when the code words are NRZ-converted so as to correspond to the data words, and, in the other of the sets, the code words are aligned in descending order of code word Digital Sum Value when the code words are NRZ-converted so as to correspond to the data words.

4. The encoding device according to claim 3, wherein the encoding unit is configured to select the code words such that a run length limitation of a shortest 0 consecutive length d (d≠0) and a longest 0 consecutive length k (k>d) of a code string obtained from an encoding result is satisfied.

5. The encoding device according to claim 4, wherein the encoding unit is configured to respectively convert the input m-bit data word into a first code word and a second code word by the first encoding table and the second encoding table, and determine whether both the first code word and the second code word satisfy the run length limitation when the first code word and the second code word are connected to a code word output at one preceding time, and select and output a code word in which the absolute value of the code string Digital Sum Value of the first code word and the second code word is smaller if both the first code word and the second code word satisfy the run length limitation.

6. The encoding device according to claim 5, wherein d=2, k=10, and encoding rate is m/n=1/2.

7. The encoding device according to claim 6, wherein m=8 and n=16.

8. An encoding method for converting m-bit data words into n-bit (both n and m are integers and $2^n \geq 2^m \times 2$) code words, the method comprising:

performing encoding by selecting and outputting a code word, in which an absolute value of a code string Digital Sum Value is smaller, from code words corresponding to the input m-bit data words in a first encoding table in which $2^m$ code words selected from $2^n$ n-bit code words correspond to $2^m$ m-bit data words and code words corresponding to input m-bit data words in a second encoding table in which $2^m$ code words, which do not overlap with the code words in the first encoding table, of the $2^n$ n-bit code words correspond to $2^m$ m-bit data words.

9. A recording device for converting m-bit data words into n-bit (both n and m are integers and $2^n \geq 2^m \times 2$) code words and performing recording with respect to an optical recording medium, the receiving device comprising:

a first encoding table in which $2^m$ code words selected from $2^n$ n-bit code words correspond to $2^m$ m-bit data words;

a second encoding table in which $2^m$ code words, which do not overlap with the code words in the first encoding table, of the $2^n$ n-bit code words correspond to $2^m$ m-bit data words;

an encoding unit configured to select and output a code word, in which an absolute value of a code string Digital Sum Value is smaller, from code words corresponding to the input m-bit data words in the first encoding table and code words corresponding to the input m-bit data words in the second encoding table; and a recording unit configured to perform recording with respect to the optical recording medium based at least in part on the code words output from the encoding unit.

10. The recording device according to claim 9, wherein the recording unit records NRZ data obtained by performing inverting to a symbol "1" and non-inverting to a symbol "0" with respect to an encoded string of code words encoded by the encoding unit in the optical recording medium.

11. The recording device according to claim 10, wherein the optical recording medium is a bulk type optical recording medium having a bulk layer for selectively performing mark recording at a plurality of positions in a depth direction, and the recording unit is configured to record marks by a blank in the bulk layer.

12. A recording method for converting m-bit data words into n-bit (both n and m are integers and $2^n \geq 2^m \times 2$) code words and performing recording with respect to an optical recording medium, the method comprising:

selecting and outputting a code word, in which an absolute value of a code string Digital Sum Value is smaller, from code words corresponding to input m-bit data words in a first encoding table in which $2^m$ code words selected from $2^n$ n-bit code words correspond to $2^m$ m-bit data words and code words corresponding to input m-bit data words in a second encoding table in which $2^m$ code words, which do not overlap with the code words in the first encoding table, of the $2^n$ n-bit code words correspond to $2^m$ m-bit data words; and performing recording with respect to the optical recording medium based on the code words output by the selecting and outputting.

13. A bulk type optical recording medium having a bulk layer for selectively performing mark recording at a plurality of positions in a depth direction, wherein a mark row is recorded in the bulk layer based at least in part on code words obtained by performing an encoding process of selecting and outputting a code word, in which an absolute value of a code string Digital Sum Value is smaller, from code words corresponding to the m-bit data words in a first encoding table in which $2^m$ code words selected from $2^n$ n-bit code words correspond to $2^m$ m-bit data words and code words corresponding to the m-bit data words in a second encoding table in which $2^m$ code words, which do not overlap with the code words in the first encoding table, of the $2^n$ n-bit code words correspond to $2^m$ m-bit data words, and both n and m are integers and $2^n \geq 2^m \times 2$.

14. The optical recording medium according to claim 13, wherein the mark row recorded in the bulk layer is a mark row based at least in part on NRZ data obtained by performing inverting to a symbol "1" and non-inverting to a symbol "0" with respect to an encoded string of encoded code words.

15. The optical recording medium according to claim 14, wherein the mark row recorded in the bulk layer is a mark row of marks formed by blanks.

16. A decoding device comprising a decoding unit which includes first and second decoding tables in which code words and data words have a same correspondence as first and second encoding tables and which searches both a first decoding table and a second decoding table for m-bit data words corresponding to input n-bit code words and outputs the m-bit data words, in which the first and second encoding tables are used when converting the m-bit data words into the n-bit (both n and m are integers and $2^n \geq 2^m \times 2$) code words, in the first encoding table, $2^m$ code words selected from $2^n$ n-bit code words correspond to $2^m$ m-bit data words, in the second encoding table, $2^m$ code words, which do not overlap with the code words in the first encoding table, of the $2^n$ n-bit code words correspond to $2^m$ m-bit data words, code words in which a number of symbols "1" is an odd number in the second encoding table correspond to data words to which code words in which a number of symbols "1" is an even number correspond to the first encoding table, code words in which a number of symbols "1" is an even number in the second encoding table correspond to data words to which code words in which a number of symbols "1" is an odd number correspond to the first encoding table, in any one set of code words in which the number of symbols "1" is an even number in the first encoding table and a set of code words in which the number of symbols "1" is an odd number in the second encoding table, the code words are aligned in ascending order of code word Digital Sum Value when the code words are NRZ-converted so as to correspond to the data words, and, in the other of the sets, the code words are aligned in descending order of code word Digital Sum Value when the code words are NRZ-converted so as to correspond to the data words, in any one set of code words in which the number of symbols "1" is an odd number in the first encoding table and a set of code words in which the number of symbols "1" is an even number in the second encoding table, the code words are aligned in ascending order of code word Digital Sum Value when the code words are NRZ-converted so as to correspond to the data words, and, in the other of the sets, the code words are aligned in descending order of code word Digital Sum Value when the code words are NRZ-converted so as to correspond to the data words, and decoding is performed with respect to a code string obtained by performing an encoding process of selecting and outputting a code word, in which an absolute value of a code string Digital Sum Value is smaller, from code words corresponding to the input m-bit data words in the first encoding table and code words corresponding to the input m-bit data words in the second encoding table.

17. A decoding method comprising the steps of searching both a first decoding table and a second decoding table, in which the code words and the data words having a same correspondence as first and second encoding tables, for m-bit data words corresponding to input n-bit code words and outputting the m-bit data words, in which the first and second encoding tables are used when converting the m-bit data words into the n-bit (both n and m are integers and $2^n \geq 2^m \times 2$) code words, in the first encoding table, $2^m$ code words selected from the $2^n$ n-bit code words correspond to $2^m$ m-bit data words, in the second encoding table, $2^m$ code words, which do not overlap with the code words in the first encoding table, of the $2^n$ n-bit code words correspond to $2^m$ m-bit data words, code words in which a number of symbols "1" is an odd number in the second encoding table correspond to data words to which code words in which a number of symbols "1" is an even number correspond to the first encoding table, code words in which a number of symbols "1" is an even number in the second encoding table correspond to data words to which code words in which a number of symbols "1" is an odd number correspond to the first encoding table, in any one set of code words in which the number of symbols "1" is an even number in the first encoding table and a set of code words in which the number of symbols "1" is an odd number in the second encoding table, the code words are aligned in ascending order of code word Digital Sum Value when the code words are NRZ-converted so as to correspond to the data words, and, in the other of the sets, the code words are aligned in descending order of code word Digital Sum Value when the code words are NRZ-converted so as to correspond to the data words, in any one set of code words in which the number of symbols "1" is an odd number in the first encoding table and a set of code words in which the number of symbols "1" is an even number in the second encoding table, the code words are aligned in ascending order of code word Digital Sum Value when the code words are NRZ-converted so as to correspond to the data words, and, in the other of the sets, the code words are aligned in descending order of code word Digital Sum Value when the code words are NRZ-converted so as to correspond to the data words, decoding is performed with respect to a code string obtained by performing an encoding process of selecting and outputting a code word, in which an absolute value of a code string Digital Sum Value is smaller, from code words corresponding to the input m-bit data words in the first encoding table and code words corresponding to the input m-bit data words in the second encoding table.

* * * * *